US00RE40947E

(19) United States
(12) Reissued Patent
Asai et al.

(10) Patent Number: US RE40,947 E
(45) Date of Reissued Patent: *Oct. 27, 2009

(54) MULTILAYER PRINTED WIRING BOARD AND ITS MANUFACTURING METHOD, AND RESIN COMPOSITION FOR FILLING THROUGH-HOLE

(75) Inventors: Motoo Asai, Ogaki (JP); Kenichi Shimada, Nagoya (JP); Kouta Noda, Ogaki (JP); Takashi Kariya, Hashima (JP); Hiroshi Segawa, Yokohama (JP)

(73) Assignee: Ibiden Co., Ltd., Ogaki-shi (JP)

( * ) Notice: This patent is subject to a terminal disclaimer.

(21) Appl. No.: 10/829,479

(22) PCT Filed: Oct. 12, 1990

(86) PCT No.: PCT/JP98/04584

§ 371 (c)(1),
(2), (4) Date: Jul. 23, 1999

(87) PCT Pub. No.: WO99/20090

PCT Pub. Date: Apr. 22, 1999

Related U.S. Patent Documents

Reissue of:
(64) Patent No.: 6,376,049
Issued: Apr. 23, 2002
Appl. No.: 09/341,689
Filed: Jul. 23, 1999

(30) Foreign Application Priority Data

| | | |
|---|---|---|
| Oct. 14, 1997 | (JP) | 9-280499 |
| Dec. 10, 1997 | (JP) | 9-340180 |
| Dec. 10, 1997 | (JP) | 9-340182 |
| Mar. 17, 1998 | (JP) | 10-067065 |

(51) Int. Cl.
*B32B 3/00* (2006.01)

(52) U.S. Cl. ..... 428/209; 428/901; 174/255; 174/257; 174/262; 174/264; 174/266; 174/1

(58) Field of Classification Search ..... 174/250–255; 428/209, 901
See application file for complete search history.

(56) References Cited

U.S. PATENT DOCUMENTS 4,816,323 A * 3/1989 Inoue ..... 428/200
5,243,142 A 9/1993 Ishikawa et al.

(Continued)

FOREIGN PATENT DOCUMENTS

EP 0 727 926 A2 8/1996
EP 0 800 336 A1 10/1997

(Continued)

OTHER PUBLICATIONS

English language abstract JP 6–275959.*
English language abstract JP 6–302956.*

(Continued)

*Primary Examiner*—Cathy Lam
(74) *Attorney, Agent, or Firm*—Oblon, Spivak, McClelland, Maier & Neustadt, P.C.

(57) ABSTRACT

A multilayer printed wiring board is composed of a substrate provided with through-holes, and a wiring board formed on the substrate through the interposition of an interlaminar insulating resin layer, the through-holes having a roughened internal surface and being filled with a filler, an exposed part of the filler in the through-holes being covered with a through-hole-covering conductor layer, and a viahole formed just thereabove being connected to the through-hole-covering conductor layer. Without peeling between the through-holes and the filler, this wiring board has a satisfactory connection reliability between the through-holes and the internal layer circuit and provides a high density wiring.

98 Claims, 8 Drawing Sheets

U.S. PATENT DOCUMENTS

| | | | | | |
|---|---|---|---|---|---|
| 5,346,750 | A | * | 9/1994 | Hatakeyama et al. | 428/209 |
| 5,484,647 | A | * | 1/1996 | Nakatani et al. | 428/209 |
| 5,744,758 | A | * | 4/1998 | Takenouchi et al. | 174/255 |
| 5,766,670 | A | * | 6/1998 | Arldt et al. | 427/8 |
| 5,972,482 | A | * | 10/1999 | Hatakeyama et al. | 428/209 |
| 6,010,768 | A | * | 1/2000 | Yasue et al. | 428/209 |
| 6,376,052 | B1 | | 4/2002 | Asai et al. | |
| 6,440,542 | B1 | * | 8/2002 | Kariya | 428/209 |
| 6,753,483 | B2 | * | 6/2004 | Andoh et al. | 174/262 |

FOREIGN PATENT DOCUMENTS

| | | | |
|---|---|---|---|
| EP | 0 804 061 | A1 | 10/1997 |
| JP | 61-100999 | | 5/1986 |
| JP | 63-52112 | | 3/1988 |
| JP | 63-66993 | | 3/1988 |
| JP | 63-52112 | * | 10/1988 |
| JP | 63-265488 | | 11/1988 |
| JP | 64-31874 | | 2/1989 |
| JP | 1-100996 | | 4/1989 |
| JP | 1-143292 | | 6/1989 |
| JP | 2-196494 | | 8/1990 |
| JP | 3-85686 | | 4/1991 |
| JP | 4-27194 | | 1/1992 |
| JP | 4-92496 | | 3/1992 |
| JP | 4-223007 | | 8/1992 |
| JP | 04-286389 | | 10/1992 |
| JP | 4-303937 | | 10/1992 |
| JP | 5-67670 | | 3/1993 |
| JP | 05-075259 | | 3/1993 |
| JP | 5-110254 | | 4/1993 |
| JP | 5-198909 | | 8/1993 |
| JP | 5-67670 | * | 9/1993 |
| JP | 5-243728 | | 9/1993 |
| JP | 05-287582 | | 11/1993 |
| JP | 6-69648 | | 3/1994 |
| JP | 6-76474 | | 3/1994 |
| JP | 6-069648 | * | 3/1994 |
| JP | 6-32368 | | 4/1994 |
| JP | 06-112640 | | 4/1994 |
| JP | 06-232560 | | 8/1994 |
| JP | 6-76474 | * | 9/1994 |
| JP | 06-275959 | | 9/1994 |
| JP | 6-275959 | | 9/1994 |
| JP | 6-283860 | | 10/1994 |
| JP | 6-302956 | | 10/1994 |
| JP | 06-302963 | | 10/1994 |
| JP | 6-338218 | | 12/1994 |
| JP | 07-079078 | | 3/1995 |
| JP | 7-162158 | | 6/1995 |
| JP | 7-188391 | | 7/1995 |
| JP | 07-188391 | | 7/1995 |
| JP | 7-202432 | | 8/1995 |
| JP | 07-226456 | | 8/1995 |
| JP | 7-283538 | | 10/1995 |
| JP | 07-283538 | | 10/1995 |
| JP | 8-83971 | | 3/1996 |
| JP | 08-078842 | | 3/1996 |
| JP | 08-139452 | | 5/1996 |
| JP | 08-181438 | | 7/1996 |
| JP | 8-279673 | | 10/1996 |
| JP | 08-316602 | | 11/1996 |
| JP | 9-8424 | | 1/1997 |
| JP | 9-8459 | | 1/1997 |
| JP | 09-012937 | | 1/1997 |
| JP | 09-023065 | | 1/1997 |
| JP | 9-92030 | | 4/1997 |
| JP | 9-116273 | | 5/1997 |
| JP | 9-130050 | | 5/1997 |
| JP | 09-148738 | | 6/1997 |
| JP | 09-181415 | | 7/1997 |
| JP | 9-181415 | | 7/1997 |
| JP | 9-260849 | | 10/1997 |
| JP | 10-22611 | | 1/1998 |
| JP | 10-027968 | | 1/1998 |
| JP | 10-070368 | | 3/1998 |
| JP | 11-266082 | | 9/1999 |
| JP | 11-307936 | | 11/1999 |
| JP | 2003-101237 | | 4/2003 |

OTHER PUBLICATIONS

English language abstract JP 5–67670.*
English language abstract JP 4–303937.*
English language abstract JP 63–52112.*
English language abstract JP 6–76474.*
English language abstract JP 5–198909.*
English language abstract JP 7–162158.*
English language abstract JP 1–100996.*
English language abstract of JP 8–83971.*
English language abstract of–JP–6–338218.*
English language abstract of–7–188931.*
English language abstract of–JP–7–283538.*
English language abstract of–JP–9–116273.*
English language abstract of–JP–6–069648.*
English language abstract of–JP–9–130050.*
English language abstract of–JP–6–283860.*
English language abstract of–JP–5–110254.*
English language abstract of JP 9–181415.*
English language abstract of JP 9–8424.*
English language abstract of JP 2–196494.*
English language abstract of JP 1–143292.*
English language abstract of JP 4–92496.*
English language abstract of JP 5–243728.*
English Language Abstract of JP 63–66993.*
English Language Abstract of JP 4–27194.*
English Language Abstract of JP 10–22611.*

* cited by examiner

MULTILAYER PRINTED WIRING BOARD AND ITS MANUFACTURING METHOD, AND RESIN COMPOSITION FOR FILLING THROUGH-HOLE

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a multilayer printed wiring board used as a package board for mounting an IC chip or the like and a process of producing the same, and more particularly to a multilayer printed wiring board capable of providing a high density wiring easily and of preventing the formation of cracks or the like in through-holes or in the neighborhood thereof when heat cycle occurs, for example.

This invention also relates to a resist composition for filling through-hole of a multilayer printed wiring board, which composition is used for ensuring satisfactory electric connections between viaholes and through-holes even at high temperature and high humidity conditions or under such conditions as to cause heat cycle.

2. Discussion of Background Information

In general, through-holes are formed for electrically connecting the front surface to the back surface of a core substrate (hereinafter referred to as "substrate") of a two-sided multilayer printed wiring board. These through-holes are, however, considered as dead spaces in designing of a circuit, and hence become one of the factors which prevent wiring from densifying.

To reduce such dead spaces, the prior art has applied, for example, the following technologies;

Japanese Unexamined Patent Publication No. 9-8424 discloses a technique of filling through-holes with a resin and roughening the resin on its surface and forming a mount pad on the roughened surface.

Japanese Unexamined Patent Publication No. 2-196494 discloses a technique of filling through-holes with a conductive paste, and dissolving and removing an electrolytic plated film covering the through-holes to form landless through-holes.

Japanese Unexamined Patent Publication No. 1-143292 discloses a technique of filling through-holes with a conductive paste and subjecting the resultant substrate to a copper plating to form a plated film covering the paste.

Japanese Unexamined Patent Publication No. 4-92496 discloses a technique of forming, for example, a copper plated film onto all over the surface of a substrate inclusive of internal surfaces of through-holes by electroless plating, filling the inside of the through-holes with an electrically conductive material (conductive paste) and then covering the substrate with a copper plated film so as to encapsulate the electrically conductive material in the through-holes.

The conventional techniques mentioned above, however, have the following disadvantages.

A two-sided multilayer printed wiring board as is described in Japanese Unexamined Patent Publication No. 9-8424 requires a roughening treatment of the surface of a resin in order to ensure adhesion between the resin filled in through-holes and the mount pad. In addition, since coefficients of thermal expansion between the resin and a metal are different, the conductor layer on the through-holes may peel or form cracks due to heat cycle.

According to the technique described in Japanese Unexamined Patent Publication No. 2-196494, when openings for viaholes are formed just above the through-holes of an interlaminar resin layer with a laser beam, the conductive paste is exposed to the openings and thereby a resin ingredient in the conductive paste is also eroded.

In a printed wiring board as is described in Japanese Unexamined Patent Publication No. 1-143292, the conductive paste is in direct contact with the internal surfaces of through-holes of a resin substrate so that metal ions are apt to disperse from the surfaces to the inside of the substrate when it takes up moisture. The dispersion (migration) of metal ions causes development of a short circuit between the conductor layer and the through-holes.

In a printed wiring board as is described in Japanese Unexamined Patent Publication No. 4-92496, gaps or voids tend to form because of poor adhesion between the conductor layer and the electric conductive material in the through-holes. The formation of voids between the electric conductive material and a through-hole causes delamination of the conductor layer or generation of cracks on the through-hole in the use at high temperature and high humidity conditions due to air or water accumulated in the voids.

In some instances, it may be desired to connect a through-hole to a viahole formed on a substrate. In this case, connection is generally made by forming a pad, i.e., a land protrusion on the periphery of the through-hole, and connecting the through-hole to the viahole through the interposition of the pad. The pad is, however, frequently obstructive because it is formed protruding on the outer periphery of the through-hole and hence causes, for example, an increasing pitch between adjacent through-holes to each other. This becomes an impediment to achieving a high density wiring or to narrower intervals between through-holes.

On the contrary, examples of conventional multilayer wiring boards having a high density wiring function are the following Japanese Unexamined Patent Publications:

Japanese Unexamined Patent Publication No. 6-275959 discloses a multilayer printed wiring board obtained by filling through-holes with a filler, forming a conductor layer thereon, and forming viaholes on the conductor layer. Japanese Unexamined Patent Publication No. 5-243728 discloses a process of filling through-holes with a conductive paste and curing the paste, polishing a surface of the substrate, forming a conductor layer covering the through-holes, and mounting a surface mount part on the conductor layer.

According to these conventional techniques, a surface mount part can be connected to through-holes so as to provide high density wiring or through-holes, but they have the following disadvantages.

The multilayer printed wiring board as exemplified in Japanese Unexamined Patent Publication No. 6-275959 is obtained by filling through-holes with a photosensitive resin as the filler. In such a wiring board, delamination between the filler and the conductor layer occurs when the wiring board is exposed to high temperature and high humidity conditions such as in Pressure Cooker Test, and a reliable connection between viaholes formed on the conductor layer and through-holes cannot be obtained.

The technique disclosed in Japanese Unexamined Patent Publication No. 5-243728 is not a technique relating to a build-up multilayer printed wiring board and hence does not make the most of the high density wiring function inherent in the build-up method.

SUMMARY OF THE INVENTION

The present invention solves the aforementioned problems inherent in the conventional techniques, and the present invention provides a multilayer printed wiring board which can easily ensure high density wiring and a production process therefor.

The present invention provides a construction of a multilayer printed wiring board which is effective for preventing delamination between a filler for a through-hole and a conductor layer, for inhibiting delamination and formation of cracks between a conductor circuit and an interlaminar insulating resin layer, for preventing metal ions in the filler from diffusing and for protecting the filler from erosion by a laser beam.

The present invention further provides high density through-hole intervals and wiring in a build-up multilayer printed wiring board without reducing an electric connection reliability between through-holes and viaholes at high temperature and high humidity conditions.

The present invention also provides a construction of a multilayer printed wiring board for ensuring a reliable electric connection between an internal layer circuit inside a substrate and build-up multilayer circuit layers on both surfaces of the substrate even when the substrate is multilayered.

The present invention also provides a construction of a resin composition used for filling through-hole of the aforementioned multilayer printed wiring boards.

The present invention provides a multilayer printed wiring board comprising a substrate provided with through-holes, and a conductor circuit formed on the substrate through the interposition of an interlaminar insulating resin layer, the through-holes being filled with a filler, wherein the internal surfaces of the through-holes are roughened, and the filler comprises metal particles and thermosetting resin or thermoplastic resin.

The invention also provides a multilayer printed wiring board comprising a substrate provided with through-holes, and a conductor circuit formed on the substrate through the interposition of an interlaminar insulating resin layer, the through-holes being filled with a filler, wherein internal surfaces of the through-holes are roughened, and the filler comprises metal particles and thermosetting resin or thermoplastic resin and an exposed portion of the filler in the through-holes is covered with a through-hole-covering conductor layer.

In addition, the present invention provides a multilayer printed wiring board comprising a substrate provided with through-holes, and a conductor circuit formed on the substrate through the interposition of an interlaminar insulating resin layer, the through-holes being filled with a filler, wherein internal surfaces of the through-holes are roughened, and the filler comprises metal particles and thermosetting resin or thermoplastic resin and an exposed portion of the filler in the through-holes is covered with a through-hole-covering conductor layer, and the through-hole-covering conductor layer is connected to a viahole formed just above the conductor layer.

Another aspect of the present invention provides a process of producing a multilayer printed wiring board comprising at least the following steps: forming a conductor layer and a through-hole on both surfaces of a substrate by at least one of electroless plating, or electroplating, forming a roughened layer on the internal surface of the through-hole, filling the through-hole provided with the roughened layer on its internal surface with a filler comprising metal particles and thermosetting resin or thermoplastic resin, and drying and curing the filler, and forming an interlaminar insulating resin layer and then forming a conductor circuit by subjecting the substrate to at least one of electroless plating, or electroplating.

Another aspect of the present invention provides a process of producing a multilayer printed wiring board comprising at least the following steps: forming a conductor layer and a through-hole on both surfaces of a substrate by at least one of electroless plating, or electroplating, forming a roughened layer on an internal surface of the through-hole, filling the through-hole with a filler comprising metal particles and thermosetting resin or thermoplastic resin, and drying and curing the filler, subjecting an exposed portion of the filler on the through-hole to at least one of electroless plating, or electroplating to form a through-hole-covering conductor layer, and forming an interlaminar insulating resin layer and then forming a conductor circuit by at least one of electroless plating, or electroplating.

Another further aspect of the present invention provides a process of producing a multilayer printed wiring board comprising at least the following steps: forming a conductor layer and a through-hole on both surfaces of a substrate by at least one of electroless plating, or electroplating, forming a roughened layer on the internal surface of the through-hole, filling the through-hole provided with the roughened layer on its internal surface with a filler comprising metal particles and thermosetting resin or thermoplastic resin, and drying and curing the filler, subjecting an exposed portion of the filler on the through-hole to an at least one of electroless plating, or electroplating to form a through-hole-covering conductor layer, forming an interlaminar insulating resin layer, and forming a viahole and a conductor circuit in the interlaminar insulating resin layer located just above the through-hole, and connecting the viahole to the through-hole-covering conductor layer.

In addition and advantageously, the present invention provides a resin composition for filling through-hole of a printed wiring board, which resin composition comprises a particulate substance, a resin and an ultrafine inorganic powder.

DETAILED DESCRIPTION OF THE PRESENT INVENTION

Figure 1:
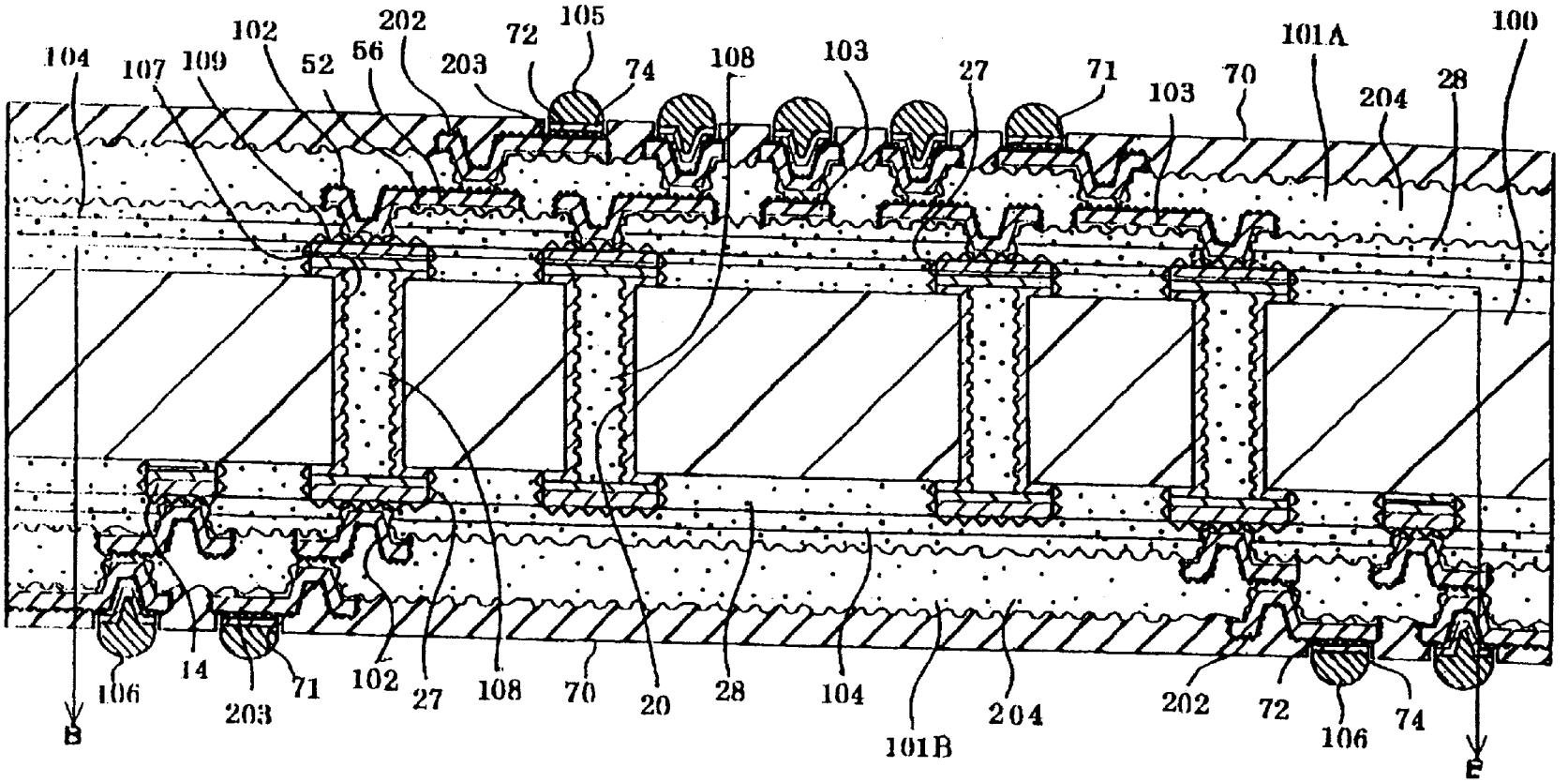
FIG. 1 is a cross section view illustrating an embodiment of the multilayer printed wiring board according to the present invention.

The multilayer printed wiring board according to one aspect of the present invention is characterized by forming a roughened layer on an internal surface conductor of the through-hole filled with a filler.

In another aspect of the present invention, relating to the printed wiring board, a through-hole-covering conductor layer is formed for covering an exposed surface of the filler filling the through-hole.

In a further aspect of the present invention, the multilayer printed wiring board is characterized by forming a viahole just above the through-hole-covering conductor layer which is formed just above the through-hole and by connecting the viahole to the conductor layer.

A yet another aspect of the present invention concerns a resin composition for filling through-hole of the aforementioned multilayer printed wiring board.

In the first feature of the present invention, a roughened layer is formed on the internal surface of the through-hole in order to bring the filler into intimate contact with the through-hole via the roughened layer and to avoid the formation of voids. If a void is formed between the filler and the through-hole, a conductor layer formed just thereabove by electroplating becomes bumpy or air in the void expands by heat and causes cracks or delamination, whereas moisture accumulated in the void causes migration or cracks. The formation of a roughened layer can avoid such defects.

When the through-hole-covering conductor layer is formed on the filler filling the through-hole according to one aspect of the present invention, wiring can be installed just above the through-hole and a viahole can be connected directly thereto, as described below. In addition, when an opening for the viahole is formed just above the through-hole in the interlaminar insulating resin layer by a laser beam, the through-hole-covering conductor layer plays a role of protecting a resin ingredient in the filler from erosion.

The viahole which is directly connected via the through-hole-covering conductor layer formed just above the through-hole, according to another aspect of the present invention, precludes the formation of a land (internal layer pad) for wiring around the through-hole as in conventional equivalents. In this case, the shape of the land of the through-hole can remain a perfect circle. Accordingly, intervals between through-holes formed in a substrate can be reduced so as to decrease dead spaces and increase the number of through-holes. In other words, this construction ensures intervals of adjacent through-holes to be as narrow as 700 μm or less.

Further, such a construction ensures lines of a back build-up wiring layer of the substrate to connect to a front build-up wiring layer through a multitude of through-holes. This means that wiring of the conductor circuit to the periphery of the substrate can be installed in both the front and back build-up layers. As described above, a plurality of wiring from plural bumps on the back surface are integrated and connected to bumps on the front surface in a multilayer printed wiring board. When through-holes are formed in high density, wiring can be integrated in front and back build-up wiring layers in the same condition so that the numbers of build-up wiring layers can be the same between the front and back surfaces and, in addition, can be reduced.

According to the present invention, the pitch between through-holes may be set to equal to or less than 700 μm in order to obtain the aforementioned operations and advantages. The pitch of equal to or less than 700 μm increases the number of through-holes and ensures connection from the front to the back build-up layers.

(1) Re: Roughened Layer

A roughened layer is formed on the internal surfaces of the through-holes and/or on the surface of the through-hole-covering conductor layer which covers the filler exposed from the through-hole. In particular, the latter roughened layer ensures a direct connection of a viahole to the through-hole-covering layer with a high reliability. Consequently, even when used at high temperature and high humidity conditions, high density wiring and through-holes in a build-up multilayer printed wiring board can easily be achieved without reducing electric connection reliability between the through-hole and viahole. In particular, when a roughened layer is additionally formed on the side face of the through-hole covering conductor layer, cracks in the interlaminar insulating resin layer starting from a boundary face between the side face of the through-hole-covering conductor layer and the interlaminar insulating resin layer can effectively be prevented from forming, whereas such cracks can be generated due to a poor adherence therebetween.

The thickness of the roughened layer formed on the internal surface of through-holes or on the surface of the conductor layer should preferably fall in the range from 0.1 to 10 μm. This is because a thicker roughened layer causes a short circuit between layers, whereas a thinner roughened layer decreases adhesion of the roughened layer with respect to an adhered layer.

These roughened layers may preferably be obtained by subjecting the conductor on the internal surface of through-holes or the surface of the through-hole-covering conductor layer to an oxidation (graphitization)-reduction treatment or a treatment with an aqueous mixture of an organic acid and a copper(II) complex, or a plating treatment with needle-formed alloy of a copper-nickel-phosphorus.

In the process using the oxidation (graphitization)-reduction treatment, an oxidation bath (graphitization bath) comprising NaOH (10 g/l), $NaClO_2$ (40 g/l) and $Na_3PO_4$ (6 g/l), and a reduction bath comprising NaOH (10 g/l) and $NaBH_4$ (6 g/l) are used.

In the treatment with an aqueous mixture of an organic acid-copper(II) complex, the solution acts as follows in the coexistence of oxygen such as in spraying or bubbling and dissolves a metal foil such as copper as a conductor circuit:

$$Cu+Cu(II)A_n \rightarrow 2Cu(I)A_{n/2}2Cu(I)A_{n/2}+(n/4)O_2+nAH\ (\text{aeration}) \rightarrow 2Cu(II)A_n+(n/2)H_2O$$

wherein A is a complexing agent (acting as a chelating agent) and n is a coordination number.

The copper(II) complex used in this treatment is preferably a copper(II) complex of an azole. The copper(II) complex of an azole acts as an oxidizing agent for oxidizing a metallic copper or the like. The preferred azole includes diazoles, triazoles and tetrazoles. Among them, imidazole, 2-methylimidazole, 2-ethylimidazole, 2-ethyl-4-methylimidazole, 2-phenylimidazole and 2-undecylimidazole are preferred.

The content of the copper(II) complex of an azole should preferably fall in the range from 1 to 15% by weight. Within this range, satisfactory solubility and stability can be obtained.

The organic acid is incorporated for dissolving a copper oxide.

As practical examples, at least one organic acid selected from formic acid, acetic acid, propionic acid, butyric acid, valeric acid, caproic acid, acrylic acid, crotonic acid, oxalic acid, malonic acid, succinic acid, glutaric acid, maleic acid, benzoic acid, glycolic acid, lactic acid, maleic acid or sulfamic acid is desirable.

The concentration of the organic acid may preferably fall in the range from 0.1% to 30% by weight. Within this range, solubility and dissolution stability of an oxidized copper can be maintained.

The produced copper(I) complex is dissolved by a function of an acid and bonded with oxygen to form a copper(II) complex and thereby to contribute oxidation of copper again.

Halogen ions such as fluorine ions, chlorine ions, bromine ions or the like may be added to the etchant comprising the organic acid-copper(II) complex for supplementing dissolution of copper or oxidation of an azole. The halogen ion can be supplied by adding hydrochloric acid, sodium chloride or the like to the solution.

The concentration of the halogen ion may preferably fall in the range from 0.01 to 20% by weight. Within this range, the formed roughened layer has a satisfactory adherence with respect to the interlaminar insulating resin layer.

The etchant comprising an organic acid-copper(II) complex may be prepared by dissolving a copper(II) complex of an azole and an organic acid (if necessary with halogen ion) in water.

The plating treatment with a needle-formed alloy of copper-nickel-phosphorus may preferably by conducted using a plating bath containing 1 to 40 g/l of copper sulfate, 0.1 to 6.0 g/l of nickel sulfate, 10 to 20 g/l of citric acid, 10 to 100 g/l of a phosphinate, 10 to 40 g/l of boric acid, and 0.01 to 10 g/l of a surfactant.

(2) Re: Filler

The first filler (A) used in the present invention should preferably comprise metal particles, a thermosetting resin and a curing agent, or metal particles and a thermoplastic resin, whereas a solvent can be added as necessary. When the surface of such a filler is polished, the metal particles contained in the filler are exposed so that the filler is integrated with a plating film formed thereon through the interposition of the exposed metal particles. Thus, delamination or peeling in a boundary face with respect to the conductor layer is prevented even when used at high temperature and high humidity conditions such as in Pressure Cooker Test (PCT). In addition, since the filler is charged in through-holes each provided with a metal film on its surface, migration of metal ions can be avoided. As the metal particles, there may be mentioned particles of copper, gold, silver, aluminum, nickel, titanium, chromium, tin/lead, palladium, platinum or others. The particle size of the metal particles may preferably fall in the range from 0.1 to 50 μm. When the particle size is less than 0.1 μm, surfaces of the metal particles are oxidized so as to reduce wettability of the filler with respect to the resin, whereas when the particle size exceeds 50 μm, the print quality is deteriorated. The metal particles may preferably be incorporated in a ratio ranging from 30 to 90% by weight with respect to the total weight. When the ratio is less than 30% by weight, the adherence of the conductor layer covering an exposed filler from through-hole is deteriorated, whereas when the ratio exceeds 90% by weight, the print quality is worsened.

Examples of the resin include epoxy resins, phenolic resins, polyimide resins, polytetrafluoroethylene (PTFE) and other fluororesins, bismaleimide-triazine (BT) resins, FEP, PFA, PPS, PEN, PES, nylon, aramid resins, PEEK, PEKK, PET and others.

The surfaces of the metal particles can be treated with a complexing agent or a modifier for improving their adherence with respect to the resin. For the thermosetting resin, any of imidazole-series, phenol-series or amine-series curing agents can be employed, and any of NMP (N-methylpyrrolidone), DMDG (diethylene glycol dimethyl ether), glycerin, water, 1-, 2- or 3-cyclohexanol, cyclohexanone, methyl cellosolve, methyl cellosolve acetate, methanol, ethanol, butanol, propanol, bisphenol A type epoxy and other solvents may be used.

The filler preferably has, as an optimum composition, a combination of a mixture of Cu powder and bisphenol F type solvent-free epoxy (manufactured by Yuka Shell Co., Ltd., trade name: E-807) in a weight ratio of 6:4 to 9:1 and a curing agent, or a combination of Cu powder, PPS and NMP in a weight ratio of 8:2:3.

As a second filler (B) used in the present invention, there may be mentioned following ones. To be more specific, such a filler (B) should be distinguished from the aforementioned filler (A), and filler (B) is essentially characterized by comprising a particulate substance, a resin and an ultrafine inorganic powder.

The aforementioned resin composition for filling through-hole comprises an inorganic ultrafine powder having an average particle size preferably ranging from 1 to 1,000 nm (more preferably from 2 to 100 nm), and when it is charged in the through-hole, a meshwork formed as a function of an intermolecular force of the ultrafine inorganic powder traps the particulate substance so as to prevent isolation and precipitation of the particulate substance. As a result, the particulate substance can be engaged into the through-hole-covering conductor layer above the filler as an anchor, and in addition, crevices for anchoring can be formed by dissolving and removing the particulate substance to contribute to effective integration of the filler and the through-hole-covering conductor layer. In particular, when the particulate substance is a metal particle, the metal particle protrudes from the surface of the filler so that the protruded metal particle and the through-hole-covering conductor layer covering the same as integrated to enhance the adherence therebetween.

Accordingly, delamination between the filler and the through-hole conductor layer can be prevented, and hence delamination between the filler and the conductor layer covering the filler can be prevented even at high temperature and high humidity conditions.

As the particulate substance, at least one member selected from metal particles, inorganic particles or resin particles is preferred. As the metal particles, those used in the filler (A) may be employed. The inorganic particles include particles of silica, alumina, mullite, silicon carbide and the like. To the surfaces of the organic particles, a surface-modifier such as a silane coupling agent can be added. As the resin particles, at least one member selected from epoxy resins, benzoguanamine resins or amino resins is advantageously employed. These resins have satisfactory adherence with respect to the constitutive resin of the filler.

The particulate substance preferably has an average particle size ranging from 0.1 to 30 μm. Such an average particle size enhances adherence with respect to the through-hole-covering conductor layer covering the filler. The concentration of the particulate substance may preferably fall in the range from 30 to 90% by weight based upon the total solid contents of the resin composition. Within this range, satisfactory adherence and print quality can be obtained simultaneously.

The constitutive resin (which should be distinguished from the aforementioned resin particle) of the resin composition for filling through-hole includes thermosetting resins and thermoplastic resins.

Preferred example of the thermosetting resin includes at least one member selected from epoxy resins, polyimide resins or phenolic resins.

As the thermoplastic resin, use may preferably made of at least one member selected from polytetrafluoroethylene (PTFE), tetrafluoroethylene-hexafluoropropylene copolymers (FEP), tetrafluoroethylene-perfluoroalcoxy copolymers (PFA) and other fluororesins, polyethylene terephthalates (PET), polysulfones (PSF), polyphenylene sulfides (PPS), thermoplastic polyphenylene ethers (PPE), polyether sulfones (PES), polyether imides (PEI), polyphenylene sulfones (PPES), polyethylene naphthalates (PEN), polyether ether ketones (PEEK), or polyolefin resins.

In particular, at least one member selected from bisphenol type epoxy resins or novolac type epoxy resins can advantageously be used as the resin for filling through-hole. The viscosity of a bisphenol type epoxy resin can be regulated by selecting from A-type resins, F-type resins or others suitably without the use of a diluent solvent. A novolac type epoxy resin has a high strength, excellent heat resistance and chemical resistance and is not disintegrated even in a strongly basic solution such as a plating solution and not degraded by heat.

As the bisphenol type epoxy resin, use is preferably made of at least one member selected from bisphenol A type epoxy resins or bisphenol F type epoxy resins. Among them, bisphenol F type epoxy resins can advantageously be employed as they can be used at a low viscosity without any solvent. At least one member selected from phenol novolac type epoxy resins and cresol novolac type epoxy resins may preferably be employed as the novolac type epoxy resin.

When a combination of a novolac type epoxy resin and a bisphenol type epoxy resin is used, the composition ratio thereof should preferably fall in the range from 1/1 to 1/100 by weight. Within this range, excessive increase of the viscosity can be prevented.

The preferred curing agent used in the resin composition includes imidazole-series curing agents, acid anhydride-series curing agents and amine-series curing agents, since these curing agents exhibit a small shrinkage in curing. By preventing such shrinkage in curing, integration between the filler and the conductor layer covering the same can be enhanced and the adherence can be improved.

The resin composition may be diluted with a solvent as necessary. As the solvent, there may be mentioned NMP (N-methylpyrrolidone), DMDG (diethylene glycol dimethyl ether), glycerin, water, 1-, 2- or 3-cyclohexanol, cyclohexanone, methyl cellosolve, methyl cellosolve acetate, methanol, ethanol, butanol, propanol and the like.

Preferably ultrafine inorganic particle (which should be distinguished from the aforementioned inorganic particle) constituting the resin composition for filling through-hole includes silica, alumina, silicon carbide and mullite, among which silica is most desirable.

The ultrafine inorganic particle should have an average particle size ranging from 1 to 1,000 nm and more preferably from 2 to 100 nm. Within this range, the particle size is fine and thus repletion of through-holes is not deteriorated, and meshwork bonds, which are estimated as hydrogen bonds, can be formed so as to trap the particulate substance.

The concentration of the ultrafine inorganic particle should preferably fall in the range from 0.1 to 5% by weight relative to the total solid contents in the resin composition. This is because precipitation of the metal particle can be prevented without deteriorating repletion within this range.

The filler being composed of the resin composition as mentioned above should be a nonconducting filler having a specific resistance of equal to or more than $10^6$ Ω·cm and more preferably equal to or more than $10^8$ Ω·cm. When the filler is electroconductive, cuttings of the filler are formed in polishing of the resin composition after curing, and they adhere between the conductor circuit so as to cause a short circuit.

In addition, to impart electric conductivity to such a resin composition, the composition should be cured and shrunk. If such a shrinkage by curing is excessive, delamination between the filler and the through-hole-covering conductor layer covering the filler occurs.

(3) Re: Interlaminar Insulating Resin Layer

The interlaminar insulating resin layer according to the present invention can be composed of an lower layer comprising a resin having excellent insulation properties and an upper layer comprising a resin having a satisfactory adherence, using any of thermosetting resins, thermoplastic resins or complexes of a thermosetting resin and a thermoplastic resin.

As the thermosetting resin, epoxy resins, polyimide resins, phenolic resins, thermosettable polyphenylene ethers (PPE) may be employed.

Examples of the thermoplastic resin include polytetrafluoroethylene (PTFE) and other fluororesins, polyethylene terephthalates (PET), polysulfones (PSF), polyphenylene sulfides (PPS), thermoplastic polyphenylene ethers (PPE), polyether sulfones (PES), polyether imides (PEI), polyphenylene sulfones (PPES), tetrafluoroethylene-hexafluoropropylene copolymers (FEP), tetrafluoroethylene-perfluoroalkoxy copolymers (PFA), polyethylene naphthalates (PEN), polyether ether ketones (PEEK) and polyolefin resins. The complex of a thermosetting resin and a thermoplastic resin includes an epoxy resin-PES, an epoxy resin-PSF, an epoxy resin-PPS, an epoxy resin-PPES and the like.

In the present invention, a glass cloth-impregnated resin complex can be used as the interlaminar insulating resin layer. The glass cloth-impregnated resin complex includes a glass cloth-impregnated epoxy, a glass cloth-impregnated bismaleimide-triazine, a glass cloth-impregnated PTFE, a glass cloth-impregnated PPE, a glass cloth-impregnated polyimide and the like.

An adhesive for electroless plating can also be used as the interlaminar insulating resin layer in the present invention.

As the adhesive for electroless plating, an adhesive formed by dispersing cured heat-resistant particles soluble in an acid or an oxidizing agent into an uncured heat-resistant resin hardly soluble in an acid or an oxidizing agent through curing treatment is most desirable. The heat-resistant resin particles are dissolved and removed by a treatment with an acid or an oxidizing agent so as to form a roughened layer composed of reverse-Ω-formed anchors on its surface.

As the cured heat-resistant resin particles in the adhesive for electroless plating, particularly preferred is at least one member selected from ① heat-resistant resin particles having an average particle size of equal to or less than 10 μm, ② agglomerate particles obtained by aggregating heat-resistant resin powder having an average particle size of equal to or less than 2 μm, ③ a mixture of heat-resistant resin powder having an average particle size ranging from 2 to 10 μm and heat-resistant resin powder having an average particle size of equal to or less than 2 μm, ④ quasi-particles obtained by adhering at least one of heat-resistant resin powder or inorganic powder each having an average particle size of equal to or less than 2 μm to surfaces of heat-resistant resin powder having an average particle size ranging from 2 to 10 μm, ⑤ a mixture of heat-resistant resin powder having an average particle size ranging from 0.1 to 0.8 μm and heat-resistant resin powder having an average particle size more than 0.8 μm and less than 2 μm, and ⑥ heat-resistant resin powder having an average particle size ranging from 0.1 to 1.0 μm. The use of any of these particles provides more complicated anchors.

As the heat-resistant resin used in the adhesive for electroless plating, the aforementioned thermosetting resins, thermoplastic resins and complexes of a thermosetting resin and a thermoplastic resin may be employed.

In the present invention, the conductor circuit (inclusive of the through-hole-covering conductor layer) formed on the substrate and the conductor circuit formed on the interlaminar insulating resin layer can be connected to each other through a viahole. The viahole may be filled with a plated film or a filler.

(4) Re: Production Process of Multilayer Printed Wiring Board

A process of producing the multilayer printed wiring board through a semi-additive process will be described below, whereas a full-additive process, a multilamination process and a pin lamination process can also be employed in the production process of the multilayer printed wiring board according to the invention.

(A) Formation of Through-hole

①. Initially, a substrate is drilled to form holes, and the surfaces of the holes and a copper foil are subjected to an electroless plating to form through-holes.

a. As the substrate, glass-epoxy substrates, polyimide substrates, bismaleimide-triazine resin substrates, fluororesin substrates and other resin substrates, copper-clad laminates of these resin substrates, ceramic substrates, metal substrates and the like can be used. In consideration of the permittivity, in particular, a both-sided copper-clad fluororesin substrate is advantageously employed. This substrate is obtained by thermo-compression bonding of a copper foil having a one-sided roughened layer to a fluororesin substrate such as polytetrafluoroethylene.

b. A multilayer core substrate can also be used as the substrate. The multilayer core substrate can be obtained by laminating a conductor layer and a prepreg in alternating order. By way of illustration, the core substrate is obtained by laminating a prepreg and a copper foil or a circuit board in alternating order, and heating and pressing the laminate to integrate, whereas the prepreg is prepared by impregnating a cloth or non-woven fabric composed of glass fibers or aramid fibers with an epoxy resin, a polyimide resin, a bismaleimide-triazine resin, a fluororesin (such as polytetrafluoroethylene) or the like to form B-stage resin. As the circuit substrate, a substrate provided with a copper pattern obtained by forming an etching resist on both surfaces of a both-sided copper-clad laminate and subjecting it to etching can be employed.

c. As the electroless plating, a copper plating is preferred. When the substrate is poor in wettability of plating such as a fluororesin substrate, its surface should be modified by, for example, a treatment with a pretreatment agent composed of an organic metallic sodium (manufactured by Junkosha Co., Ltd., trade name: Tetraetch), or plasma treatment.

②. Next, an electroplating is conducted for plating up. A copper plating is desirable as the electroplating.

When the roughened layer is formed by electroless plating, an aqueous plating solution containing $2.2\times10^{-2}$ to $4.1\times10^{-2}$ mol/l of copper ions, $2.2\times10^{-3}$ to $4.1\times10^{-3}$ mol/l of nickel ions and 0.20 to 0.25 mol/l of phosphinic acid ions is preferably employed. Within this composition, the crystal structure of a deposited film is in needle-form so as to exhibit a satisfactory anchoring effect.

A complexing agent and/or a additive can be added to the electroless plating aqueous solution in addition to the above compounds. Further, a surfactant may also be added to the solution in a concentration ranging from 0.01 to 10 g/l. Preferred surfactant includes, for example, acetylene-containing polyoxyethylene surfactants such as Surfinol 440, 465 and 485 manufactured by Nisshin Kagaku Kogyo Co., Ltd.

In other words, when the roughened layer is formed by electroless plating, an aqueous plating solution containing 1 to 40 g/l of copper sulfate, 0.1 to 6.0 g/l of nickel sulfate, 10 to 20 g/l of citric acid, 10 to 100 g/l of a phosphinate, 10 to 40 g/l of boric acid, and 0.01 to 10 g/l of a surfactant is advantageously used.

③. Further, a roughened layer is formed by roughing the internal surfaces of through-holes and the surface of the electrolytic plated film. The roughened layers may be obtained by a graphitization (oxidation)-reduction treatment, by spray-treatment with an aqueous mixture of an organic acid and a copper(II) complex, or by plating with a needle-formed alloy of copper-nickel-phosphorus.

When the roughened layers are formed by an oxidation-reduction treatment, an oxidation bath containing NaOH (20 g/l), $NaClO_2$ (g/l) and $Na_3PO_4$ (15.0 g/l) and a reduction bath containing NaOH (2.7 g/l) and $NaBH_4$ 1.0 g/l) are preferably employed.

When the roughened layers are formed through etching with an aqueous solution of an organic acid and a copper(II) complex, the surface of copper is roughened as a function of oxidizing properties of divalent copper in the solution. A typical example of the solution includes (CZ8100 solution manufactured by MEC Co., Ltd.

The roughened layer may be covered with a layer of a metal or noble metal having an ionization tendency of more than copper but less than titanium. Such a metal or noble metal layer covering the roughened layer can prevent the dissolution of the conductor circuit due to a local electrode reaction created in the roughening of the interlaminar insulating resin layer. The thickness of this layer is preferably from 0.01 to 2 μm.

As the metal, preferred is at least one metal selected from titanium, aluminium, zinc, iron, indium, thallium, cobalt, nickel, tin, lead or bismuth. The noble metal includes, for instance, gold, silver, platinum and palladium. Among them, tin is desirable, because it can form a thin layer through electroless substitution plating and can advantageously be followed to the roughened layer. When tin is employed, a solution of tin borofluoride-thiourea or tin chloride-thiourea is used. In this case, Sn layer having a thickness ranging from 0.01 to 2 μm through Cu—Sn substitution reaction. When a noble metal is used, sputtering method, vaporization method or the like is employed.

(2) Filling of Filler

①. The through-holes formed in the step (1) are filled with a filler. To be more specific, the filler is charged into the through-holes by applying it, through printing process, onto the substrate on which a mask having openings according to the through-hole portions is placed, and then dried and cured.

According to the present invention, a conductive paste can be employed instead of the filler. The conductive paste is composed of metal powder and a resin, whereas a solvent can be added thereto as necessary. As the metal powder, powder of Cu, Au, Ag, Al, Ni, Pd, Pt, Ti, Cr, Sn/Pb or the like may be used. The metal powder should preferably have a particle size ranging from 0.1 to 30 μm. The resin includes, for instance, epoxy resins, phenolic resins, polyimide resins, polytetrafluoroethylene (PTFE) and other fluororesins, bismaleimide-triazine (BT) resins, FEP, PFA, PPS, PEN, PES, nylon, aramid resins, PEEK, PEKK and PET. As the solvent, any of NMP (N-methylpyrrolidone), DMDG (diethylene glycol dimethyl ether), glycerin, water, 1-, 2- or 3-cyclohexanol, cyclohexanone methyl cellosolve, methyl cellosolve acetate, methanol, ethanol, butanol, propanol, bisphenol A type epoxy and other solvents can be used.

In order to improve adherence between the metal powder and the resin, a modifier for metal surface such as a saline coupling agent may be added to the filler. In addition, other additives such as defoaming agents inclusive of acrylic defoaming agents and silicon defoaming agents, silica, alumina, talc and other inorganic fillers can also be added. To the surfaces of the metal particle, a silane coupling agent may be attached.

The filler is printed in the following condition, for example. That is, printing is conducted using a print masking plate of Tetlon mesh plate and a square squeegee of 45° in the condition of Cu paste viscosity: 120 Pa·s, squeegee rate: 13 mm/min, squeegee amount: 1 mm.

②. The filler protruding from the through-hole and the surface of the electrolytic plated film on the substrate are removed by polishing to smooth the surface of the substrate. The polishing may preferably be carried out through belt sander abrasion or buffing. A part of the metal particles are exposed to the surface by the polishing and hence adherence between the metal particles and the through-hole-covering conductor layer is enhanced.

(3) Formation of Conductor Layer

①. Catalyst nuclei are applied to the smoothed surface of the substrate in the step (2), and then the surface is subjected to an electroless plating and an electroplating to form an electroless plated film having a thickness ranging from 0.1 to 5 μm. Where necessary, the surface is further subjected to an electroplating to form an electrolytic plated film having a thickness ranging from 5 to 25 μm.

Next, a photosensitive dry film is laminated onto the surface of the plated film, a photomask film (preferably made of glass) imaged with a pattern is placed thereon, exposed to light and then developed with a developer to form an etching resist. A portion where resist is not formed is then subjected to etching to form a conductor circuit portion and a through-hole-covering conductor layer portion which covers the filler.

As the preferred etchant, there may be mentioned an aqueous solution of sulfuric acid-hydrogen peroxide, an aqueous solution of a peroxosulfate such as ammonium peroxodisulfate, sodium peroxodisulfate and potassium peroxodisulfate, or an aqueous solution of iron(II) chloride or copper(II) chloride.

②. The etching resist is then peeled off to form an independent conductor circuit and through-hole-covering conductor layer, and then a roughened layer is formed onto the surfaces of the conductor circuit and the through-hole-covering conductor layer.

When the roughened layer is formed on the surfaces of the conductor circuit and the through-hole-covering conductor layer, the conductors are excellent in adherence with respect to the interlaminar insulating resin layer so that cracks starting from a boundary face between the side face of the conductor circuit and through-hole-covering conductor layer which covers the filler and the insulating resin layer can be prevented. On the other hand, the through-hole-covering conductor layer covering the filler can effectively contribute to improvement of adherence with respect to viaholes which are electrically connected thereto. The roughened layers may be formed according to any of the processes mentioned above, such as a graphitization (oxidation)-reduction treatment, a plating with a needle-formed alloy or an etching process.

After roughening, a resin is applied and charged between the conductor circuits and then cured in order to reduce unevenness due to the conductor layer formed on surface of the substrate. The surface of the resin should preferably be polished and smoothed so that the conductor is exposed. As the resin used for cladding, a resin composed of a bisphenol A type epoxy resin, bisphenol F type epoxy resin or other bisphenol type epoxy resin, an imidazole curing agent and inorganic particles is desirable. Such a bisphenol type epoxy resin has a low viscosity and a satisfactory applicability. Among them, a bisphenol F type epoxy resin can be applied without solvent, and hence is advantageous as to prevent the formation of cracks or delamination caused by volatilization of a solvent in heating and curing.

It is preferable that a roughened layer is formed on surface of each of the conductors after polishing.

As the forming process of the conductor layer, the following steps can be employed.

To be more specific, a plating resist is formed onto the substrate after completion of the steps ① and ②, and a non-resist-formed portion is subjected to an electroplating so as to form a conductor circuit and a through-hole-covering conductor layer portion. A solder plated film is then formed on these conductors using a solder electroplating solution composed of tin borofluoride, lead borofluoride, hydroborofluoric acid and peptone. The plating resist is then removed, and the electroless plating film and copper foil located beneath the plating resist are removed by etching, and then the solder plating film is dissolved and removed with an aqueous solution of borofluoric acid to form a conductor layer.

(4) Formation of Interlaminar Insulating Resin Layer and Conductor Circuit

①. An interlaminar insulating resin layer is formed on the conductor layer on the substrate thus prepared.

As the interlaminar insulating resin layer is used any of thermosetting resins, thermoplastic resins or complexes of a thermosetting resin and a thermoplastic resin. The aforementioned adhesive for electroless plating can also be used as a material for the interlaminar insulating resin.

The interlaminar insulating resin layer is formed by applying an uncured solution of any of these resins with a roll coater or a curtain coater, or laminating a resin film through thermo-compression bonding. At this time, the interlaminar insulating resin layer formed on the conductor circuit of the substrate frequently has a state of causing unevenness due to the fact that the thickness of the interlaminar insulating resin layer on the conductor circuit pattern is thin and the thickness of the interlaminar insulating resin layer on the conductor circuit having a large area is thick. Accordingly, it is desirable that the surface of the interlaminar insulating resin layer is smoothed by pressing a metal plate or a metal roll onto the interlaminar insulating resin layer of the uneven state while heating.

②. Next, an opening is formed in the interlaminar insulating resin layer to ensure an electric connection with respect to a lower-layer conductor circuit covered by the interlaminar insulating resin layer.

The opening is formed by light exposure and development when the interlaminar insulating resin layer is composed of a photosensitive resin, and by a laser beam irradiation when it is composed of a thermoplastic resin or a thermoplastic resin. The laser beam includes a carbon dioxide gas laser, an ultraviolet ray laser, an excimer laser and the like. When the opening is formed by a laser beam irradiation, the substrate may be subjected to a desmearing treatment. The desmearing treatment can be conducted using an oxidizing agent composed of an aqueous solution of chromic acid, a permanganate or the like, or by a treatment with an oxygen plasma.

③. After forming the interlaminar insulating resin layer provided with the opening, its surface is roughened as necessary.

When the above-mentioned adhesive for electroless plating is used as the interlaminar insulating resin layer, the surface of the insulating layer is subjected to a roughening treatment by selectively and removing only the heat-resistant resin particles existing in the surface of the insulating layer through dissolution or decomposition with an acid or an oxidizing agent. As the acid, there may be mentioned phosphoric acid, hydrochloric acid, sulfuric acid, or organic acids including formic acid, acetic acid and others. Particularly, the use of the organic acid is desirable, because it hardly corrodes the metal conductor layer exposed from the viahole in the roughening treatment.

As the oxidizing agent, it is desirable to use chromic acid, or a permanganate (potassium permanganate or the like)

When a thermosetting resin or a thermoplastic resin is employed as the insulating resin layer, a roughening treatment on the surface of the layer using an oxidizing agent selected from aqueous solutions of chromic acid, permanganates and the like is also effective.

In case of fluororesin (polytetrafluoroethylene or the like) which is not roughened by an oxidizing agent, the surface of the layer is roughened by, for example, a plasma treatment or a treatment with Tetraetch (a metallic naphthalene compound manufactured by Junkosha Co., Ltd.).

④. Catalyst nuclei for electroless plating are applied to the resin layer.

In general, palladium-tin colloid is used as the catalyst nuclei. The substrate is dipped in a solution of the colloid, dried and then heated to fix the catalyst nuclei on the surface of the resin. Alternatively, the catalyst nuclei can be formed by driving metal nuclei onto the surface of the resin through CVD, sputtering or plasma.

In this case, the metal nucleic are embedded on the surface of the resin, and plating is deposited with the metal nuclei as cores to form conductor circuits. Therefore, even when a resin which is hardly roughened or a resin having a poor adherence with respect to the conductor circuit such as a fluororesin (polytetrafluoroethylene or the like) is used, adherence can be ensured. As the metal nuclei, at least one metal selected from palladium, silver, gold, platinum, titanium, copper and nickel is preferred.

The amount of the metal nuclei should preferably be equal to or less than 20 $\mu g/cm^2$. When it exceeds this range, removal of the metal nuclei is required.

⑤. An electroless plated film is formed on the full surface of the interlaminar insulating resin layer by subjecting the layer to an electroless plating. The electroless plated film should preferably have a thickness ranging from 0.1 to 5 μm, and more preferably from 0.5 to 3 μm.

⑥. A plating resist is formed on the electroless plated film. The plating resist is formed by laminating a photosensitive resin film on the plated film and subjecting the resultant laminate to a light exposure and development, as mentioned above.

⑦. An electrolytic plated film is formed on the electroless plated film other than the portion on which the plating resist is formed to plate up the conductor circuit portion (inclusive of the viahole portion). As the electroplating, it is desirable to use an electrolytic copper plating, and the thickness thereof is favorably from 5 to 30 μm.

⑧. After removing the plating resist, the electroless plated film beneath the plating resist is removed by dissolving in an etchant to form independent conductor circuits (including viaholes).

As the etchant, an aqueous solution of a mixture of sulfuric acid and hydrogen peroxide, an aqueous solution of a persulfate such as ammonium persulfate, sodium persulfate and potassium persulfate, an aqueous solution of iron chloride, copper chloride or the like is advantageously used.

It is desirable that the viaholes are filled with an electrolytic plated metal to form so-called filled viaholes in order to ensure smoothness of the interlaminar insulating resin layer.

Preferred embodiment of the multilayer printed wiring board of the present invention will now be described with reference to the drawings.

FIG. 1 is a cross section view illustrating a multilayer printed wiring board according to an embodiment of the invention, which has a construction composed of a substrate 100, and build-up wiring layers 101A, 101B respectively formed on the front and back surfaces of the substrate 100. Each of the build-up layers 101A, 101B is composed of an interlaminar insulating resin layer 104 provided with a viahole 102 and a conductor circuit 103, and an interlaminar insulating resin layer 204 provided with a viahole 202 and a conductor circuit 203.

A solder bump 105 is formed on the front surface for connecting to a bump of an IC chip (not shown), and a solder bump 106 is formed on the back surface for connecting to a bump of a mother board (not shown). In the multilayer printed wiring board, a conductor circuit starting from the solder bump 105 connecting to the IC chip is routed in the peripheral direction of the substrate, and connected to the solder bump 106 connecting to the mother board. The front build-up layer 101A and the back build-up layer 101B are connected to each other through through-holes 107 formed on the substrate 100.

To be more specific, the through-holes 107 are filled with a filler 108, and a through-hole-covering conductor layer 109 is so formed as to cover an exposed surface of the filler 108 from the through-holes 107. The upper-layer viahole 102 is connected to the conductor layer 109, and, the upper-layer viahole 202 is connected to the conductor circuit 103 connecting to the viahole 102. The solder bumps 105, 106 are formed on the viahole 202, or on the conductor circuit 203 connecting to the viahole 202.

In the multilayer printed wiring board according to the invention, which has the aforementioned construction, the through-hole-covering conductor layer 109 located above the filler 108 in the through-holes 107 is formed round, and the viahole 102 is connected directly to the conductor layer 109. By connecting in the above manner, the areas just above the through-holes 107 can play a role as an internal layer pad and hence the formation of a dead space can be avoided. In addition, the wiring board does not require addition of an internal layer pad for connecting from the through-holes 107 to the viahole 102 as in conventional equivalents, the land shape of the through-hole 107 can be set to round. As a result, the number of through-holes can be increased by densifying the through-holes 107 formed in the substrate 30.

Thus, routing for dispersing the conductor circuits to the periphery of the substrate can be conducted on both the front and back build-up layers 101A, 101B. In a multilayer printed wiring board, a plurality of wiring from plural front bumps are connected to back bumps while being integrated, as described above. By forming the through-holes in a high density, wiring can be integrated at the same pace between the front and back build-up wiring layers 101A, 101B.

Accordingly, the numbers of the layers of the front and back build-up wiring layers 101A, 101B can be set to the same and can be reduced.

EXAMPLES

Example 1

(1) As a starting material, was employed a copper-clad laminate (manufactured by Matsushita Electric Works, Ltd., trade name: R4737) composed of a substrate 1 of a polytetrafluoroethylene resin (hereinafter briefly referred to as trade name: Teflon) of 0.8 mm in thickness and a copper foil 2 of 18 μm in thickness laminated on the substrate 1, the surface adjacent to the copper foil 2 being roughened (see FIG. 2(a)). Initially, the copper-clad laminate was drilled to form a hole and the internal surface of the hole was treated with a modifier (manufactured by Junkosha Co., Ltd., trade name: Tetraetch) composed of an organic metallic sodium to improve the wettability of the surface (see FIG. 2(b)).

A palladium-tin colloid was then applied to substrate, and the substrate was immersed in an electroless plating solution having the following composition to form an electroless plated film of 2 μm in thickness all over the surface of the substrate.

| | |
|---|---|
| EDTA | 150 g/l |
| Copper sulfate | 20 g/l |
| HCHO | 30 ml/l |
| NaOH | 40 g/l |
| α,α'-Bipyridyl | 80 ml/l |
| PEG | 0.1 g/l |

at a liquid temperature of 70° C. for 30 minutes.

Figure 2:
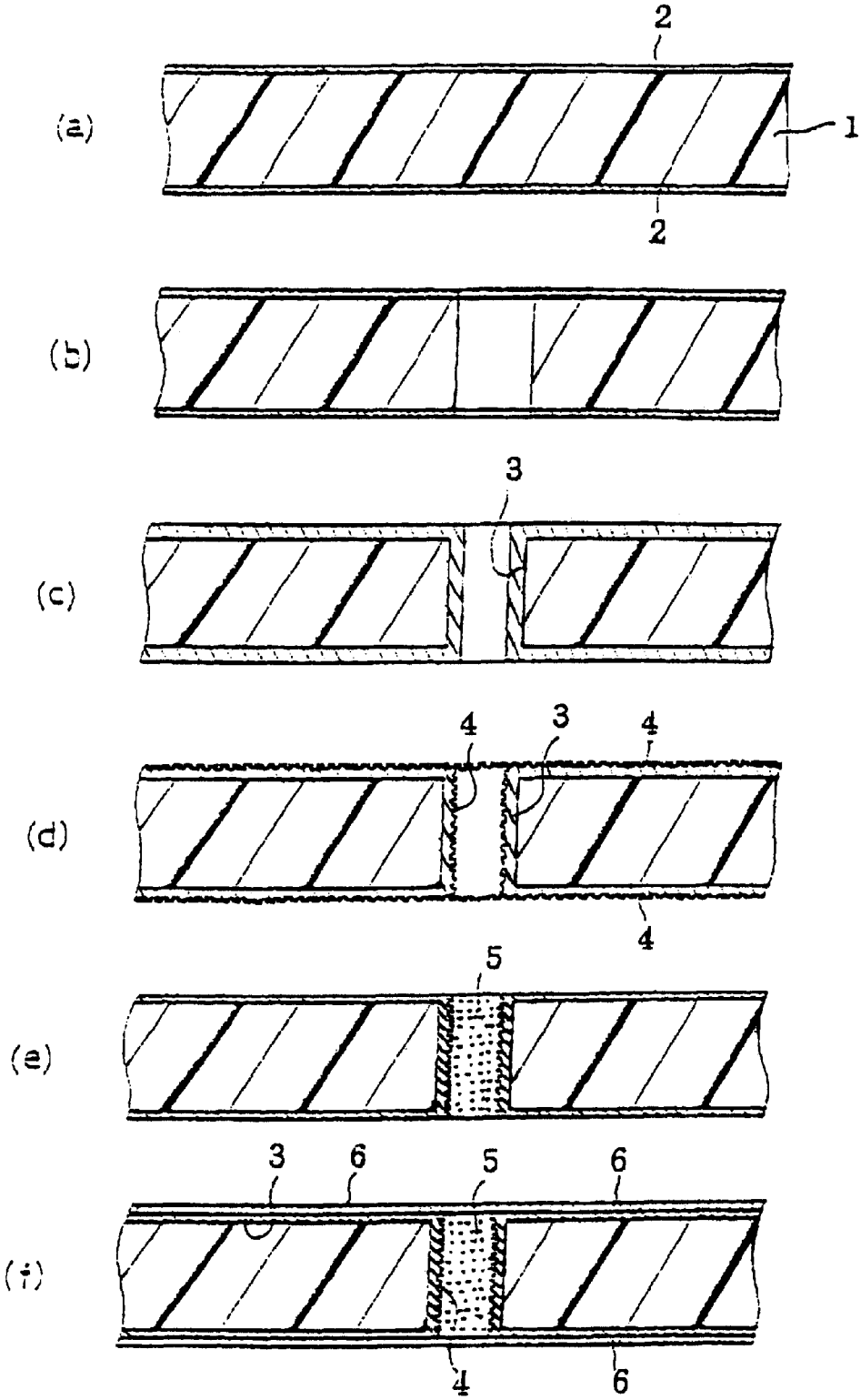
FIGS. 2(a)–(f) is a diagram illustrating some of the production steps of the multilayer printed wiring board according to the present invention.

Further, the substrate was subjected to an electrolytic copper plating under the following conditions to form an electrolytic copper plated film having a thickness of 15 μm (see FIG. 2(c)).

| | |
|---|---|
| Sulfuric acid | 180 g/l |
| Copper sulfate | 80 g/l |
| Additive (manufactured by Atotech Japan, trade name: Capalacid GL) | 1 ml/l |
| Current density | 1 A/dm$^2$ |
| Time | 30 minutes |
| Temperature | room temperature |

(2) The substrate provided with conductors (inclusive of through-holes 3) composed of the electroless plated copper film and electrolytic plated copper film was washed with water and dried. The substrate was then subjected to an oxidation-reduction treatment using an oxidation bath (graphitization bath) containing NaOH (10 g/l), $NaClO_2$ (40 g/l) and $Na_3PO_4$ (6 g/l), and a reduction bath containing NaOH (10 g/l) and $Na_4$ or $NaBH_4$ (6 g/l) to form a roughed layer 4 all over the surfaces of the conductors inclusive of the through-holes 3 (see FIG. 2(d)).

(3) Next, the through-holes 3 were filled with a filler 5 composed of copper particles having an average particle size of 10 μm. a bisphenol F type epoxy resin/an imidazole curing agent=70/25/5 (by weight) through screen printing, and then dried and cured. The roughened layer 4 located above the conductors and the filler 5 protruded from the through-holes 3 were removed by belt sander abrasion using a #600 belt abrasive paper (manufactured by Sankyo Rikagaku Co., Ltd.), and the substrate was further subjected to buffing for removing scratches caused by the belt sander abrasion to smooth the surface of the substrate (see FIG. 2(e)).

(4) A palladium catalyst (manufactured by Atotech) was applied to the surface of the substrate smoothed in the above step (3), and the substrate was then subjected to an electroless copper plating according to a conventional method to form an electroless copper plated film 6 having a thickness of 0.6 μm (see FIG. 2(f)).

(5) An electrolytic copper plated film 7 having a thickness of 15 μm was then formed on the substrate by an electrolytic copper plating under the following conditions to plate up portions to be conductor circuits and those to be through-hole-covering conductor circuit covering the filler 5 charged in the through-holes 3.

| | |
|---|---|
| Sulfuric acid | 180 g/l |
| Copper sulfate | 80 g/l |
| Additive (manufactured by Atotech Japan, trade name: Capalacid GL) | 1 ml/l |
| Current density | 1 A/dm$^2$ |
| Time | 30 minutes |
| Temperature | room temperature |

(6) A commercially available photosensitive dry film was adhered to both surfaces of the substrate provided with portions to be the conductor circuits and the through-hole-covering conductor layer, and a mask was placed on the film. The resultant substrate was then exposed to a light at 110 mJ/cm$^2$, developed with a 0.8% sodium carbonate solution to form an etching resist 8 having a thickness of 15 μm (see FIG. 3(a)).

Figure 3:
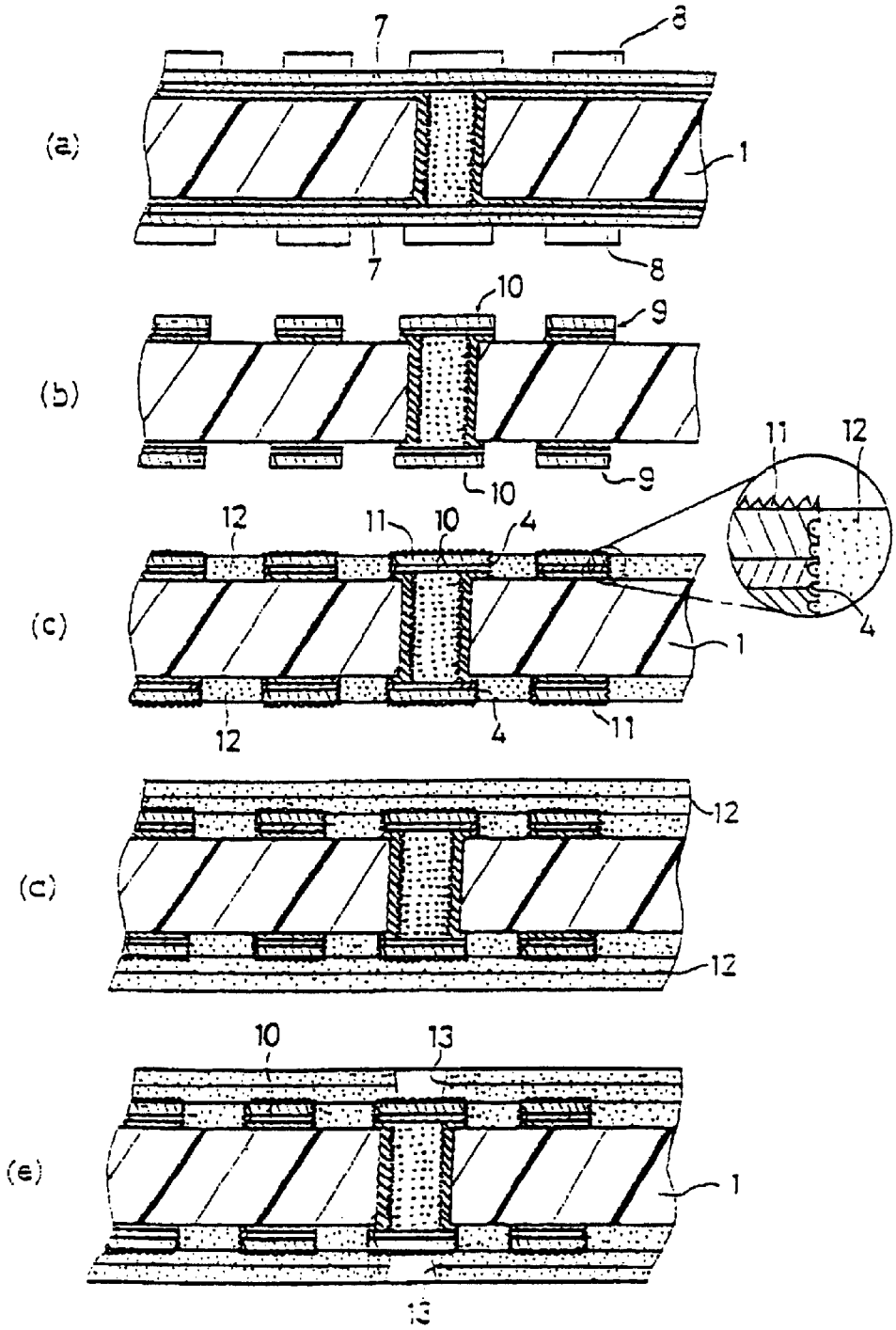
FIGS. 3(a)–(e) is a diagram illustrating some of the production steps of the multilayer printed wiring board according to the present invention.

(7) The plated film in the portion where the etching resist 8 was not formed was removed by dissolving the film through etching with a mixture of sulfuric acid and hydrogen peroxide, and the etching resist 8 was peeled off by a 5% KOH solution to form an independent conductor circuits 9 and a through-hole-covering conductor layer 10 covering the filler 5 (see FIG. 3(b)).

(8) A roughened layer 11 of a Cu—i—P alloy having a thickness of 2.5 μm was formed on the surfaces of the conductor circuits 9 and the through-hole-covering conductor layer 10 covering the filler 5, and a Sn layer having a thickness of 0.3 μm was formed on the surface of the roughened layer 11 (see FIG. 3(c), the Sn layer is not shown). These layers were formed in the following manner: The substrate was acidically degreased and soft-etched, followed by a treatment with a catalyst solution of palladium chloride and an organic acid to give a Pd catalyst. After activating the catalyst, the substrate was immersed in an electroless plating solution of pH of 9 containing 8 g/l of copper sulfate, 0.6 g/l of nickel sulfate, 15 g/l of citric acid, 29 g/l of sodium hypophosphite, 31 g/l of boric acid and 0.1 g/l of a surfactant to form a roughened layer 11 of a Cu—Ni—P alloy on the surfaces of the conductor circuits 9 and the through-hole-covering conductor layer 10 covering the filler 5. The substrate was then subjected to a Cu—Sn substitution reaction at a temperature of 50° C. and pH of 1.2 using an aqueous solution containing 0.1 mol/l of tin borofluoride and 1.0 mol/l of thiourea to form a Sn layer of 0.3 μm in thickness on the surface of the roughened layer 11 (the Sn layer is not shown).

(9) Teflon sheets (manufactured by Du Pont Company, trade name: Teflon® FEP) of 25 μm in thickness where laminated respectively to both surfaces of the substrate at a temperature of 200° C. and a pressure of 20 kg/cm$^2$, and then annealed at a temperature of 290° C. to form an interlaminar insulating resin layer 12 (see FIG. 3(d)).

(10) An opening 13 for the formation of viahole having a diameter of 25 μm was formed in the insulating Teflon resin layer 12 by an ultraviolet ray laser of 10.6 μm in wavelength (see FIG. 3(e)). Further, the surface of the insulating Teflon resin layer 12 was roughened by a plasma treatment. The plasma treatment was carried out at 500 W and a pressure of 500 mTorr for 10 minutes.

(11) A Pd nucleus was embedded into the surface of the insulating Telfon resin layer 12 by sputtering with the use of Pd as a target at an atmospheric pressure of 0.6 Pa, a temperature of 100° C. and a power of 200 W for 1 minute. At this time, SV-4540 manufactured by Nihon Shinku Gijutstu K.K. was used as a device for sputtering. The amount of the sputtered Pd was set to equal to or less than 20 $\mu g/cm^2$. The Pd amount was determined by immersing the substrate in a 6 N hydrochloric acid solution, measuring the total amount of eluted Pd and dividing the total Pd by the exposing area.

Figure 4:
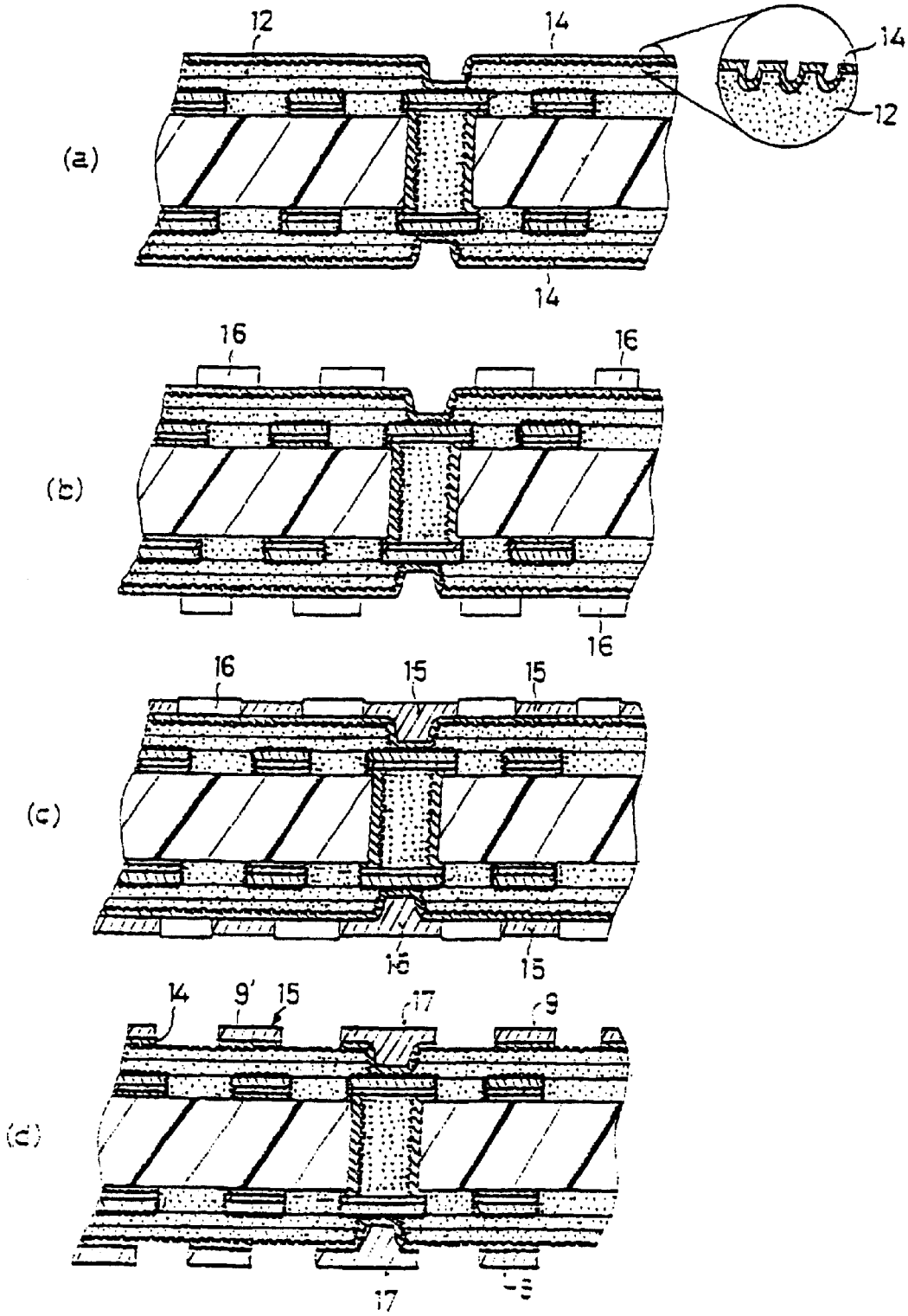
FIGS. 4(a)–(d) is a diagram illustrating some of the production steps of the multilayer printed wiring board according to the present invention.

(12) The substrate after the treatment in the step (11) was subjected to the electroless plating in the step (1) to form an electroless plated film 14 of 0.7 μm in thickness on the surface of the insulating Teflon resin layer 12 (see FIG. 4(a)).

(13) Commercially available photosensitive dry films were separately laminated on both surfaces of the substrate provided with the electroless plated film 14 in the step (12), and photomask films were placed thereon, and the substrate was exposed to a light at 100 $mJ/cm^2$ and developed with a 0.8% sodium carbonate solution to form a plating resist 16 having a thickness of 15 μm (see FIG. 4(b)).

(14) An electrolytic plated film 15 having a thickness of 15 μm was formed on the substrate by electroplating described in the step (1) to plate up the portions of the conductor circuit 9 and to fill the portion of the viahole 17 with a plating (see FIG. 4(c)).

(15) Further, after peeling off the plating resist 16 with a 5% KOH solution, the electroless plated film 14 located beneath the plating resist 16 was removed by dissolving through etching with the use of a mixture of sulfuric acid and hydrogen peroxide to form conductor circuits 9' (including filled viaholes 17) of 16 μm in thickness composed of the electroless copper plated film 14 and the electrolytic copper plated film 15. Thus, a multilayer printed wiring board was manufactured (see FIG. 4(d)).

Example 2

Multilayer Core Substrate (1) A two-sided copper-clad laminate 1' of 0.5 mm in thickness was prepared, and provided with an etching resist on both surfaces, and subjected to an etching treatment with an aqueous solution of sulfuric acid and hydrogen peroxide to obtain a substrate provided with conductor circuits. A glass-epoxy prepreg and a copper foil 2 were in turn laminated onto both surfaces of the substrate, pressed at a temperature raging from 165 to 170° C. and a pressure of 20 $kg/cm^2$ to give a multilayer core substrate 1' (see FIG. 5(a)).

Figure 5:
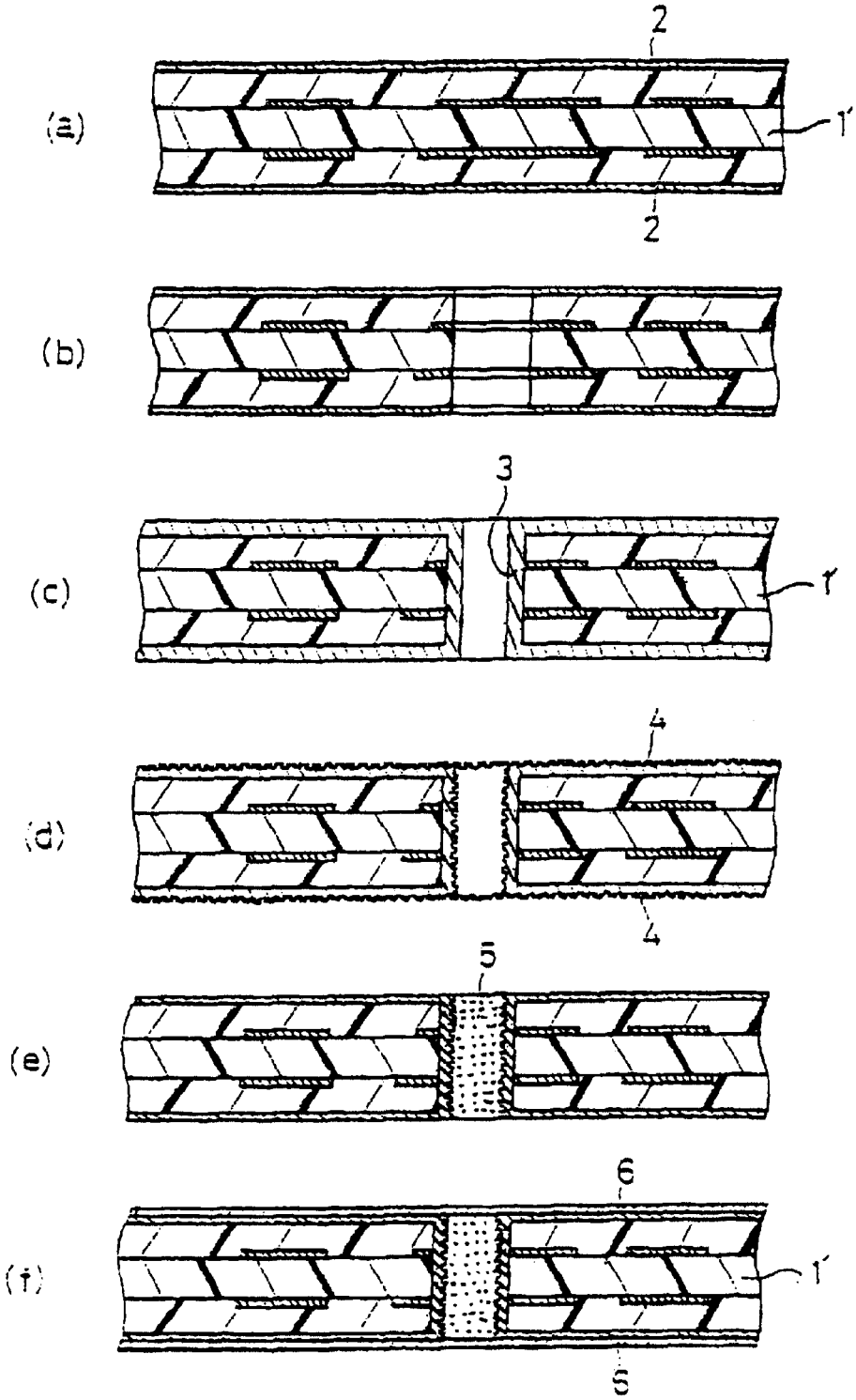
FIGS. 5(a)–(f) is a diagram illustrating some of the production steps of the multilayer printed wiring board according to the present invention.

(2) The multilayer core substrate 1' was then drilled to form through holes having a diameter of 300 μm (see FIG. 5(b)), applied with a palladium-tin colloid and then immersed in an electroless plating solution having the same composition as in Example 1 to form an electroless plated film of 2 μm in thickness all over the substrate. The substrate was then subjected to an electrolytic copper plating in the same condition as in Example 1 to form an electrolytic copper plated film 3 having a thickness of 15 μm (see FIG. 5(c)).

(3) A roughened layer 4 was formed all over the surface of the conductor 3 inclusive of through-holes in the same manner as in Example 1 (see FIG. 5(d)).

(4) A filler 5 (a nonconducting copper paste for filling, manufactured by Tatsuta Densen Co., Ltd., trade name: DD Paste) containing copper particles having an average particle size of 10 μm was charged into the through-hole 3, and the surface of the substrate was smoothed (see FIG. 5(e)).

(5) An electroless copper plated film 6 was then formed on the surface of the substrate smoothed in the step (4) in a similar manner to Example 1 (see FIG. 5(f)).

(6) An electrolytic copper plated film 7 of 15 μm in thickness was formed by subjecting the substrate to an electrolytic copper plating according to the conditions of the step (2) in a similar manner to Example 1 to form portions to be a conductor circuits 9 and a through-hole-covering conductor layer 10 (to be a round through-hole land).

Figure 6:
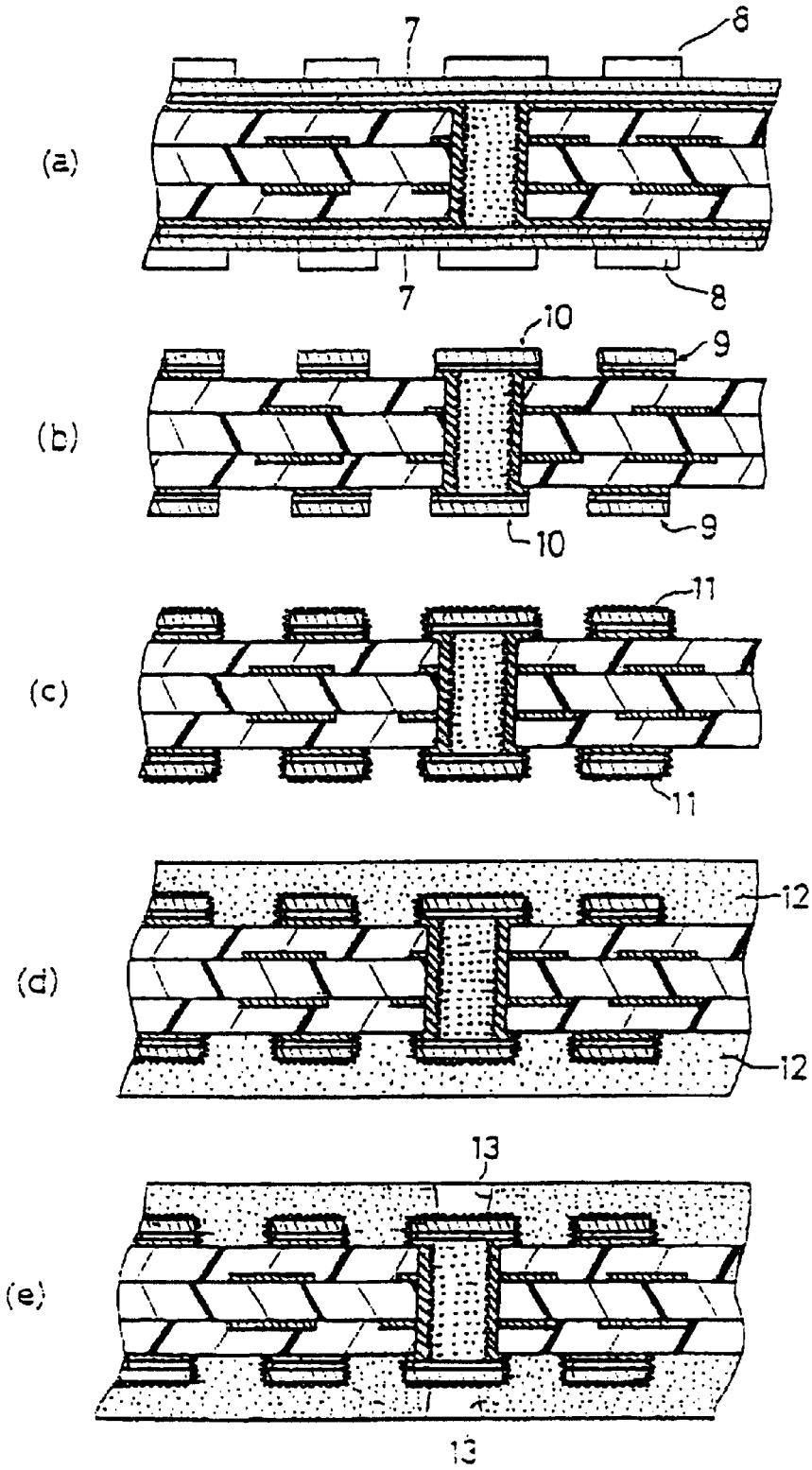
FIGS. 6(a)–(e) is a diagram illustrating some of the production steps of the multilayer printed wiring board according to the present invention.

(7) An etching resist 8 was formed on both surfaces of the substrate provided with portions to be the conductor circuits 9 and the conductor layer 10 in the same manner as in Example 1 (see FIG. 6(a)).

(8) The plated film in the portion where the etching resist was not formed was peeled off in a similar manner to Example 1 to form independent conductor circuits 9 and a through-hole-covering conductor layer 10 covering the filler 5 (see FIG. 6(b)).

(9) Subsequently, a roughened layer 11 was formed on the surfaces of the conductor circuit 9 and the through-hole-covering conductor layer 10 covering the filler 5 in the same manner as in Example 1.

(10) An adhesive A for electroless plating and an insulating agent B were prepared in the following manner.

A. Preparation of Adhesive A for Upper-layer Electroless Plating

①. To 35 parts by weight (solid content 80%) of a 25% acrylated product of a cresol novolac type epoxy resin (manufactured by Nippon Kayaku Co., Ltd., molecular weight: 2,500) were added 3.15 parts by weight of a photosensitive monomer (manufactured by Toa Gosei Co., Ltd., Aronix M315), 0.5 part by weight of a defoaming agent (manufactured by Sannopko, S-65) and 3.6 parts by weight of NMP, and the resultant mixture was admixed with stirring.

②. A mixture of 12 parts by weight of polyether sulfone (PES), 7.2 parts by weight of epoxy resin particles (manufactured by Sanyo Kasei Co., Ltd., Polymerpole) having an average particle size of 1.0 μm, 3.09 parts by weight of the epoxy resin particles having an average particle size of 0.5 μm was stirred. Subsequently, 30 parts by weight of NMP was added to the mixture and stirred and admixed by a bead mill.

③. A mixture of 2 parts by weight of an imidazole curing agent (manufactured by Shikoku Kasei Co., Ltd., 2E4MZ-CN), 2 parts by weight of a photoinitiator (manufactured by Ciba Geigy, Irgacure I-907), 0.2 part by weight of a photosensitizer (manufactured by Nippon Kayaku Co., Ltd., DETX-S) and 1.5 parts by weight of NMP was admixed by stirring. An adhesive composition A for upper-layer electroless plating was prepared by mixing the above mixtures ① to ③.

B. Preparation of Insulating Agent B for Lower-layer Electroless Plating

① To 35 parts by weight (solid content: 80%) of a 25% acrylated product of a cresol novolac type epoxy resin (manufactured by Nippon Kayaku Co., Ltd., molecular weight: 2,500) were added 4 parts by weight of a photosensitive monomer (manufactured by Toa Gosei Co., Ltd., Aronix M315), 0.5 part by weight of a defoaming agent (manufactured by Sannopko, S-65) and 3.6 parts by weight of NMP, and the resultant mixture was stirred.

②. After admixing 12 parts by weight of polyether sulfone (PES) and 14.49 parts by weight of an epoxy resin particles (manufactured by Sanyo Kasei Co., Ltd., Polymerpole) having an average particle size of 0.5 μm, 20 parts by weight of NMP was added to the mixture and the resultant mixture was mixed while stirring by a bead mill.

③. A mixture of 2 parts by weight of an imidazole curing agent (manufactured by Shikoku Kasei Co., Ltd., 2E4MZ-CN), 2 parts by weight of a photoinitiator (manufactured by Ciba Geigy, Irgacure I-907), 0.2 part by weight of a photosensitizer (manufactured by Nippon Kayaku Co., Ltd., DETX-S) and 1.5 parts by weight of NMP was admixed while stirring. An insulating agent B for lower-layer electroless plating was prepared by admixing the above mixtures ① to ③.

(11) The insulating agent B for electroless plating (viscosity: 1.5 Pa·s) prepared in the step (10) was applied onto both surfaces of the substrate with a roll coater and allowed to stand in a horizontal position for 20 minutes, and then dried at a temperature of 60° C. for 30 minutes. Subsequently, the adhesive A for electroless plating (viscosity: 1.0 Pa·s) was applied to the substrate by a roll coater, allowed to stand in a horizontal position for 20 minutes, and then dried at a temperature of 60° C. for 30 minutes to form an adhesive layer 12 (two-layer structure) having a thickness of 40 μm (see FIG. 6(d), the two-layer structure of the adhesive layer, however, is omitted in the view).

(12) A photomask film depicted with a full circle (black circle) of 85 μm in diameter was attached to both surfaces of the adhesive layers 12 formed on both surfaces of the substrate and exposed to a light irradiation at 500 mJ/cm$^2$ by an ultra-high pressure mercury lamp. The exposed substrate was developed by spraying a DMDG (diethylene glycol dimethyl ether) solution to form openings for via-hole of 85 μm in diameter on the adhesive layer. The substrate was further exposed to a light irradiation at 3,000 mJ/cm$^2$ by an ultra-high pressure mercury lamp and heated at 100° C. for 1 hour and subsequently at 150° C. for 5 hours to form an interlaminar insulating material layer (adhesive layer) 12 of 35 μm in thickness provided with openings (openings 13 for the formation of viahole) having excellent dimensional precision corresponding to the photomask film (see FIG. 6(e)). Incidentally, the tin plated layer was partly exposed in the opening for the viahole.

(13) The substrate provided with the openings 13 for the formation of viahole was immersed in chromic acid for 20 minutes to dissolve and remove the epoxy resin particles on the surface of the adhesive layer, whereby the surface of the adhesive layer 12 was roughened at a roughened depth of $R_{max}$=1–5 μm, and then immersed in a neutralizing solution (manufactured by Shipley) and washed with water.

(14) Catalyst nuclei were applied to the surfaces of the adhesive layer 12 and the openings 13 for the formation of viahole by giving a palladium catalyst (manufactured by Atotech Co., Ltd.) to the substrate having the roughened surface (roughened depth: 3.5 μm) of the adhesive layer.

Figure 7:
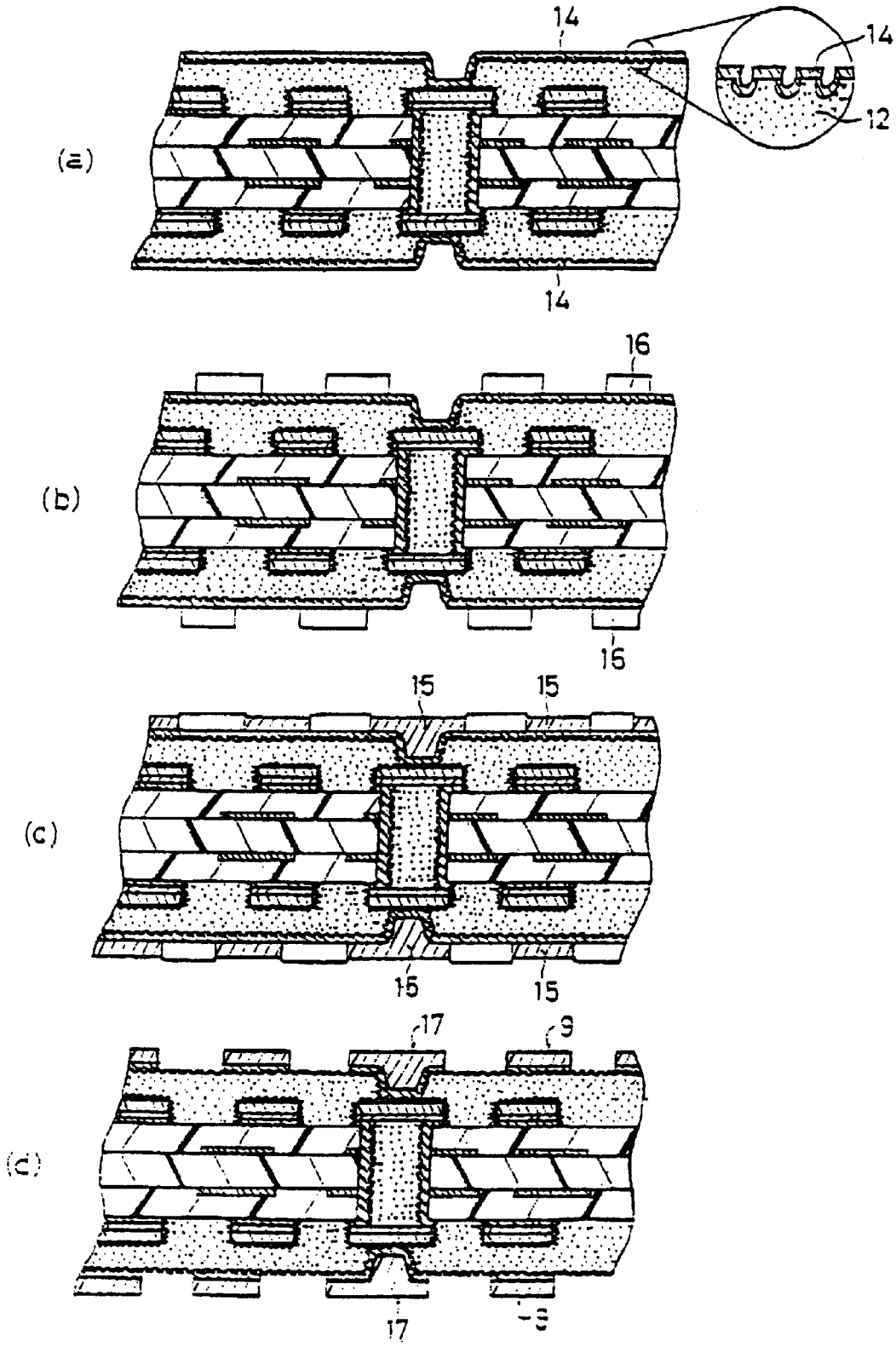
FIGS. 7(a)–(d) is a diagram illustrating some of the production steps of the multilayer printed wiring board according to the present invention.

(15) The substrate was immersed in an electroless copper plating bath having the same composition with the step (2) to form an electroless copper plated film 14 of 0.6 μm in thickness all over the roughened surface (see FIG. 7(a)). At this step, since the electroless copper plated film 14 was thin, convexoconcave following the roughened surface of the adhesive layer 12 was observed on the surface of the electroless copper plated film 14.

(16) A commercially available photosensitive dry film was adhered to the electroless copper plated film 14, and a mask was placed onto the dry film, exposed to a light at 100 mJ/cm$^2$ and developed with a 0.8% sodium carbonate solution to form a plating resist 16 having a thickness of 15 μm (see FIG. 7(b)).

(17) The substrate was then subjected to an electrolytic copper plating under the same condition as in the step (6) to form an electrolytic copper plated film 15 having a thickness of 15 μm, and thereby to plate up the conductor circuits and the viaholes (see FIG. 7(c)).

(18) After the plating resist 16 was peeled off by spraying a 5% KOH solution, the electroless plated film 15 located beneath the plating resist 16 was dissolved and removed by etching with a mixed solution of sulfuric acid and hydrogen peroxide to form conductor circuits (inclusive of viaholes) each consisting of the electroless copper plated film 14 and the electrolytic copper plated film 15 and having a thickness of 16 μm, and thereby a multilayer printed wiring board having three layers on each side was obtained (see FIG. 7(d)). Pd remained in the roughened surface of the adhesive layer 12 was removed by immersing in chromic acid (800 g/l) for 1 to 10 minutes.

The multilayer printed wiring board prepared by the above mentioned manner ensures through-holes each provided with a perfectly circular land, and it can provide a land pitch of about 600 μm and thereby through-holes can be formed in a high density so as to density through-holes easily. In addition, since the number of through-holes in the substrate can be increased, an electric connection with respect to conductor circuits in the multilayer core substrate can sufficiently be ensured through the through-holes.

Example 3

A multilayer printed wiring board was manufactured in the same manner as in Example 1, except that when through-holes were filled with a copper paste, a through-hole-covering conductor layer 10 for covering an exposed copper paste from the through-holes was not formed. According to this process, pits might be formed because the surface of the copper paste was frequently removed in the formation of openings on an insulating resin layer by a laser beam irradiation.

Example 4

A multilayer printed wiring board was obtained in a similar manner to Example 1, except that the following composition was employed as the filler.

| | |
|---|---|
| Bisphenol F type epoxy resin (manufactured by Yuka Shell Co., Ltd., E-807) | 100 parts by weight |
| Imidazole curing agent (manufactured by Shikoku Kasei Co., Ltd., 2E4MZ-CN) | 5 parts by weight |
| Copper powder having a particle size of 15 μm or less (manufactured by Fukuda Metal Foil and Powder Co., Ltd., SCR-Cu-15) | 735 parts by weight |
| Aerosil (#200) | 10 parts by weight |
| Defoaming agent (manufactured by Sannopko, Pernol S4) | 0.5 part by weight |

Comparative Example 1

The procedure of example 1 was repeated to produce a multilayer printed wiring board, except that a bisphenol F type epoxy resin containing no metal particle was used as the filler for filling the through-hole.

Comparative Example 2

A multilayer printed wiring board was produced in a similar manner to Example 1, except that through-holes were filled with the epoxy resin and the surfaces of the epoxy resin exposed from the through-holes were roughened with chromic acid and then covered with a conductor layer.

Comparative Example 3

A multilayer printed wiring board was obtained in the same manner as in Example 1, except that a roughened layer was not formed on the surface of the internal conductor on the through-holes.

(Results)

A heat cycle test of −55° C.×15 min., ambient temperature×10 min. and 125° C.×15 min at 1,000 times was conducted with respect to the multilayer printed wiring boards according to the examples and comparative examples.

In addition, the presence or absence of migration of copper between through-holes was observed by conducting a PCT (pressure cooker test) under conditions of humidity of 100%, temperature of 121° C., and pressure of 2 atm for 200 hours.

As a result, viaholes could be formed just above the through-holes according to the multilayer printed wiring boards of Examples 1 to 4 of the present invention, and thus high density through-holes could easily be obtained. In addition, no peeling was observed between the filler and the internal surface conductor of the through-hole, or between the filler and the through-hole-covering conductor, and neither crack nor migration was found in the heat cycle test and PCT.

On the contrary, dispersion (migration) of copper was observed along with the glass cloth in the Teflon substrate in the multilayer printed wiring board of Comparative Example 1. Peeling of the conductor layer covering around the through-holes was observed in the multilayer printed wiring boards of Comparative Examples 2 and 3.

Example 5

(1) A copper-clad laminate composed of a BT (bismaleimide-triazine) resin substrate 1 of 0.8 mm in thickness and a copper foil 2 of 18 μm in thickness having a single-sided roughened surface and laminated on the substrate 1 was used as a starting material (see FIG. 2(a)). Initially, the copper-clad laminate was drilled (see FIG. 2(b)), and applied with a palladium-tin colloid, and subjected to an electroless plating in the same composition and conditions as in Example 1.

Subsequently, the substrate was subjected to an electrolytic copper plating in the same conditions as in Example 1 to form an electrolytic copper plated film having a thickness of 15 μm (see FIG. 2(c)).

(2) The substrate provided with conductors (inclusive of through-holes) consisting of an electroless copper plated film and an electrolytic copper plated film formed all over its surface was subjected to an oxidation-reduction treatment in the same conditions as in Example 1 to form a roughened layer 4 over the full surfaces of the conductors inclusive of through-holes 3 (see FIG. 2(d)).

A resin composition (filler) 5 for filling through-hole was prepared by kneading, through three rolls, 3.5 parts by weight of a cresol novolac type epoxy resin (manufactured by Yuka Shell Co., Ltd., Epikote 152), 14.1 parts by weight of a bisphenol F type epoxy resin (manufactured by Yuka Shell Co., Ltd., Epikote 807), 1.0 part by weight of ultrafine silica particles (Aerosil R202) having an average particle size of 14 nm, 1.2 parts by weight of an imidazole curing agent (manufactured by Shikoku Kasei Co., Ltd., 2E4MZ-CN) and 100 parts by weight of copper powder having an average particle size of 15 μm, and adjusting the viscosity of the mixture to the range from 200 to 300 Pa·s at 22±1° C.

(3) The prepared filler 5 was charged in the through-holes 3 by screen printing, dried and then heated at 80° C., 100° C. and 120° C. for each 1 hour, and at 150° C. for 1 hour to cure.

Subsequently, the surface of the substrate was smoothed by removing the roughened surface positioned above the through-holes and the filler 5 protruding from the through-holes 3 by means of belt sander abrasion using a #400 belt abrasive paper (manufactured by Sankyo Rikagaku Co., Ltd.), and further buffing the substrate with alumina abrasive grains or SiC abrasive grains for removing scratches due to the belt sander abrasion (see FIG. 2(e)).

(4) A palladium catalyst (manufactured by Atotech Co., Ltd.) was applied to the surface of the substrate smoothed in the step (3), and the substrate was subjected to an electroless copper plating in the same conditions as in Example 1 to form an electroless copper plated film 6 having a thickness of 0.6 μm (see FIG. 2(f)).

(5) An electrolytic copper plated film 7 of 15 μm in thickness was formed by subjecting the substrate to an electrolytic copper plating according to the conditions of the step (1) to plate up portions to be conductor circuits 9 and to form a portion to be a conductor layer (to be a round through-hole land) 10 for covering the filler 5 charged in the through-hole 3.

(6) An etching resist 8 having a thickness of 15 μm was formed on both surfaces of the substrate provided with portions to be conductor circuits 9 and a conductor layer 10 in a similar manner to Example 1 (see FIG. 3(a)).

(7) Next, the plating film positioned in a portion not provided with the etching resist 8 was dissolved and removed by etching with a solution containing a mixture of sulfuric acid and hydrogen peroxide, and the etching resist 8 was peeled off by a 5% KOH solution to form independent conductor circuits 9 and a through-hole-covering conductor layer 10 covering the filler 5 (see FIG. 3(b)). In addition, the surfaces of the conductors inclusive of side surfaces were roughened by an oxidation-reduction treatment in a similar manner to the step (2).

①. A mixture was prepared by kneading 100 parts by weight of a bisphenol F type epoxy monomer (manufactured by Yuka Shell Co., Ltd., molecular weight: 310, YL983U), 170 parts by weight of spherical $SiO_2$ particles (manufactured by Admatech Co., Ltd., CRS 1101-CE, where the maximum particle size was set to below the thickness (15 μm) of an internal layer copper pattern mentioned below) coated with a silane coupling agent on their surfaces and having an average particle size of 1.6 μm, and 1.5 parts by weight of a leveling agent (manufactured by Sannopko, Pernol S4) through three rolls and adjusting a viscosity to the range from 45,000 to 49,000 cps at 23±1° C.

②. Imidazole curing agent (manufactured by Shikoku Kasei Co., Ltd., 2E4MZ-CN) of 6.5 parts by weight. An interlaminar insulating resin agent 12 was prepared by mixing the above ingredients ① and ②.

(8) The prepared interlaminar insulating resin agent 12 was charged to gaps between the conductor circuits 9 or of the through-hole-covering conductor layer 10 by applying to one surface of the substrate through screen printing, dried at 70° C. for 20 minutes. Similarly, the resin filler 12 was charged in gaps between the conductor circuits 9 or of the conductor layer 10 on the other surface of the substrate, dried at 70° C. for 20 minutes. In other words, the interlaminar insulating resin agent 12 was charged between the internal layer copper patterns in this step.

(9) One surface of the substrate after the treatment of the step (8) was polished by belt sander abrasion with the use of a #400 belt abrasive paper (manufactured by Sankyo Rikagaku Co., Ltd.) so as to avoid the interlaminar insulating resin agent 12a from remaining on the surfaces of the internal layer copper patterns 9 and 10, and subsequently, buffed for removing scratches due to the belt sander abrasion. The other surface of the substrate was also subjected to a series of these polishing treatments.

Next, the interlaminar insulating resin agent 12 was cured by heating at 100° C. for 1 hour, at 120° C. for 3 hours, at 150° C. for 1 hour and at 180° C. for 7 hours.

Accordingly, both surfaces of the substrate were smoothed by removing the surface areas of the interlaminar insulating resin agent 12 charged in gaps of the conductor circuits 9 or of the through-hole-covering conductor layer 10, and the roughened layer 11 positioned above the conductor circuits 9 or the through-hole-covering layer 10 to give a substrate in which the interlaminar insulating resin agent 12 and the conductor circuits 9 or a side surface of the through-hole-covering conductor layer 10 were firmly adhered to each other through the interposition of the roughened layer 11. That is, the surface of the interlaminar insulating resin agent 12 and those of the internal layer copper patterns could be aligned in the same plane by this step. In this step, the charged cured resin had a Tg point (glass transition point) of 155.6° C. and a linear thermal expansion coefficient of $44.5\times10^{-6}$/° C.

(10) A roughened layer 11 of a Cu—Ni—P alloy having a thickness of 2.5 μm was formed on the surfaces of the conductor circuits 9 and the through-hole-covering conductor layer 10 covering the filler 5, and a Sn layer having a thickness of 0.3 μm was formed on the surface of the roughened layer 11 (see FIG. 3(c), where the Sn layer is not shown).

These layers were formed in the following manner: The substrate was acidically degreased and soft-etched, and then treated with a catalyst solution containing palladium chloride and an organic acid to apply a Pd catalyst. After activating the catalyst, the substrate was immersed in an electroless plating solution of pH of 9 containing 8 g/l of copper sulfate, 0.6 g/l of nickel sulfate, 15 g/l of citric acid, 29 g/l of sodium hypophosphite, 31 g/l of boric acid and 0.1 g/l of a surfactant to form a roughened layer 11 of a Cu—Ni—P alloy having a thickness of 2.5 μm on the surfaces of the copper conductor circuits. The substrate was then subjected to a Cu—Sn substitution reaction at a temperature of 50° C. and pH of 1.2 by immersing in an electroless tin plating solution containing 0.1 mol/l of tin borofluoride and 1.0 mol/l of thiourea for 1 hour to form a Sn layer of 0.3 μm in thickness on the surface of the roughened layer (the Sn layer is not shown).

(11) Adhesives A and B for electroless plating were prepared in the following manner.

A. Preparation of Adhesive A for Upper-layer Electroless Plating

①. To 35 parts by weight of a 25% acrylated product of a cresol novolac type epoxy resin (manufactured by Nippon Kayaku Co., Ltd., molecular weight: 2,500) were added 3.15 parts by weight of a photosensitive monomer (manufactured by Toa Gosei Co., Ltd., Aronix M315), 0.5 part by weight of a defoaming agent (manufactured by Sannopko, S-65) and 3.6 parts by weight of NMP, and the resultant mixture was admixed with stirring.

②. A mixture of 12 parts by weight of polyether sulfone (PES), 7.2 parts by weight of epoxy resin particles (manufactured by Sanyo Kasei Co., Ltd., Polymerpole) having an average particle size of 1.0 μm, 3.09 parts by weight of the epoxy resin particles having an average particle size of 0.5 μm was stirred. Subsequently, 30 parts by weight of NMP was added to the mixture and stirred and admixed by a bead mill.

③. A mixture of 2 parts by weight of an imidazole curing agent (manufactured by Shikoku Kasei Co., Ltd., 2E4MZ-CN), 2 parts by weight of a photoinitiator (manufactured by Kanto Kagaku Co., Ltd., benzophenone), 0.2 part by weight of a photosensitizer (manufactured by Hodogaya Kayaku Co., Ltd., EAB) and 1.5 parts by weight of NMP was admixed by stirring.

An adhesive A for upper-layer electroless plating was prepared by mixing the above mixtures ① to ③.

B. Preparation of Insulative Agent B for Lower-layer Electroless Plating

①. To 35 parts by weight of a 25% acrylated product of a cresol novolac type epoxy resin (manufactured by Nippon Kayaku Co., Ltd., molecular weight: 2,500) were added 4 parts by weight of a photosensitive monomer (manufactured by Toa Gosei Co., Ltd., Aronix M315), 0.5 part by weight of a defoaming agent (manufactured by Sannopko, S-65) and 3.6 parts by weight of NMP, and the resultant mixture was stirred.

②. After admixing 12 parts by weight of polyether sulfone (PES) and 14.49 parts by weight of epoxy resin particles (manufactured by Sanyo Kasei Co., Ltd., Polymerpole) having an average particle size of 0.5 μm, 20 parts by weight of NMP was added to the mixture and the resultant mixture was stirred and mixed by a bead mill.

③. A mixture of 2 parts by weight of an imidazole curing agent (manufactured by Shikoku Kasei Co., Ltd., 2E4MZ-CN), 2 parts by weight of a photoinitiator (manufactured by Kanto Kagaku Co., Ltd., benzophenone), 0.2 part by weight of a photosensitizer (manufactured by Hodogaya Kayaku Co., Ltd., EAB) and 1.5 parts by weight of NMP was admixed while stirring.

An adhesive B for lower-layer electroless plating was prepared by admixing the above mixtures ① to ③.

(12) Initially, the insulative adhesive B for electroless plating (viscosity: 1.5–3.2 Pa·s) and the adhesive A for electroless plating (viscosity: 5–20 Pa·s) each prepared in the step (11) were applied in turn to both surfaces of the substrate using a roll coater, allowed to stand in a horizontal position for 20 minutes and dried at 60° C. for 30 minutes to form an adhesive layer 12 (two-layer structure) having a thickness of 40 μm (see FIG. 3(d)). Further, a polyethylene terephthalate film was applied onto the adhesive layer 12 through a pressure-sensitive adhesive.

(13) A photomask film printed with a full circle of 85 μm in diameter was closely adhered to the adhesive layer 12 formed on both surfaces of the substrate, and exposed to an irradiation at 500 mJ/cm$^2$ by an ultra-high pressure mercury lamp. The exposed substrate was developed by spraying a DMDG (diethylene glycol dimethyl ether) solution to form openings for viahole of 85 μm in diameter on the adhesive layer. The substrate was further exposed to an irradiation by an ultra-high pressure mercury lamp at 3,000 mJ/cm$^2$ and heated at 100° C. for 1 hour and subsequently at 150° C. for 5 hours to form an interlaminar insulating material layer (adhesive layer) 12 of 35 μm in thickness provided with openings (openings 13 for the formation of viahole) having an excellent dimensional precision corresponding to the photomask film (see FIG. 3(e)). Incidentally, the tin plated layer was partly exposed in the opening for viahole.

(14) The substrate provided with the openings 13 for the formation of viahole was immersed in chromic acid for 19 minutes to dissolve and remove the epoxy resin particles on the surface of the adhesive layer, whereby the surface of the adhesive layer was roughened at a roughened depth of $R_{max}$=1–5 μm, and then immersed in a neutralizing solution (manufactured by Shipley) and washed with water.

(15) Catalyst nuclei were applied to the surfaces of the adhesive layer 12 and the openings 13 for the formation of viahole by giving a palladium catalyst (manufactured by Atotech Co., Ltd.) to the substrate having the roughened surface (roughened depth: 3 μm) of the adhesive layer.

(16) The substrate was immersed in an electroless copper plating bath having the same composition with the step (1) to form an electroless copper plated film of 0.6 μm in thickness all over the roughened surface (see FIG. 4(a)). At this step, since the electroless plated film was thin, unevenness was observed on the surface of the electroless plated film.

(17) A commercially available photosensitive resin film (dry film) was adhered to the electroless copper plated film 14, and a mask was closely placed onto the dry film, exposed to a light irradiation at 100 mJ/cm$^2$ and developed with a 0.8% sodium carbonate solution to form a plating resist 16 having a thickness of 15 μm (see FIG. 4(b)).

(18) The substrate was then subjected to an electrolytic copper plating under the same condition as the step (1) to form an electrolytic copper plated film 15 having a thickness of 15 μm and thereby to plate up the conductor circuit portions and viahole portions (see FIG. 4(c)).

(19) After the plating resist 16 was peeled off through a 5% KOH solution, the electroless plated film 15 located beneath the plating resist 16 was dissolved and removed by etching with a mixed solution of sulfuric acid and hydrogen peroxide to form conductor circuits 9 (inclusive of viaholes 17) consisting of the electroless copper plated film 14 and the electrolytic copper plated film 15 and having a thickness of 16 μm (see FIG. 4(d)).

(20) The substrate provided with the conductor circuits 9 (inclusive of viaholes 17) in the step (19) was immersed in an electroless plating solution of pH of 9 containing 8 g/l of copper sulfate, 0.6 g/l of nickel sulfate, 15 g/l of citric acid, 29 g/l of sodium hypophosphite, 31 g/l of boric acid and 0.1 g/l of a surfactant to form a roughened layer 11 of copper-nickel-phosphorus having a thickness of 3 μm on the surface of the conductor circuits. In this case, the roughened layer 11 contained 98% by mole of Cu, 1.5% by mole of Ni and 0.5% by mole of P as analyzed by EPMA (electron probe microanalysis; fluorescent X-ray analysis).

Further, the substrate was washed with water and immersed in an electroless tin substitution plating bath containing 0.1 mol/l of tin borofluoride and 1.0 mol/l of thiourea at 50° C. for 1 hour to form a tin substitution plated layer of 0.05 μm in thickness on the surface of the roughened layer 11 (where tine substituted layer is not shown).

Figure 8:
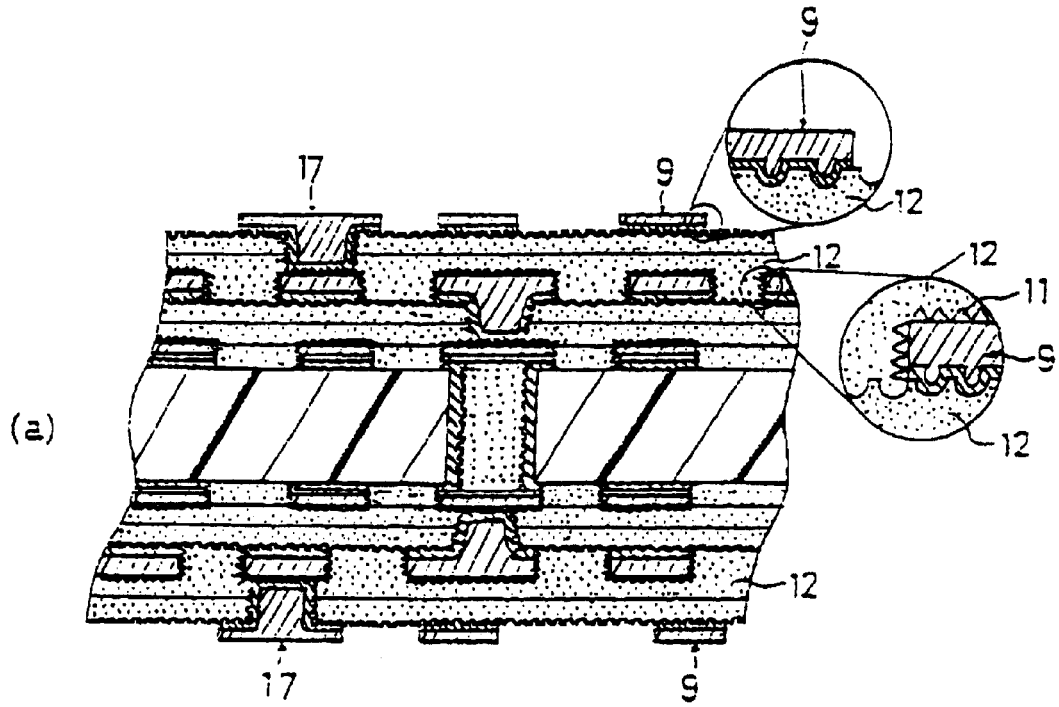
FIGS. 8(a) and (b) is an enlarged cross section view illustrating a part of the multilayer printed wiring board according to the present invention.
Figure 8:
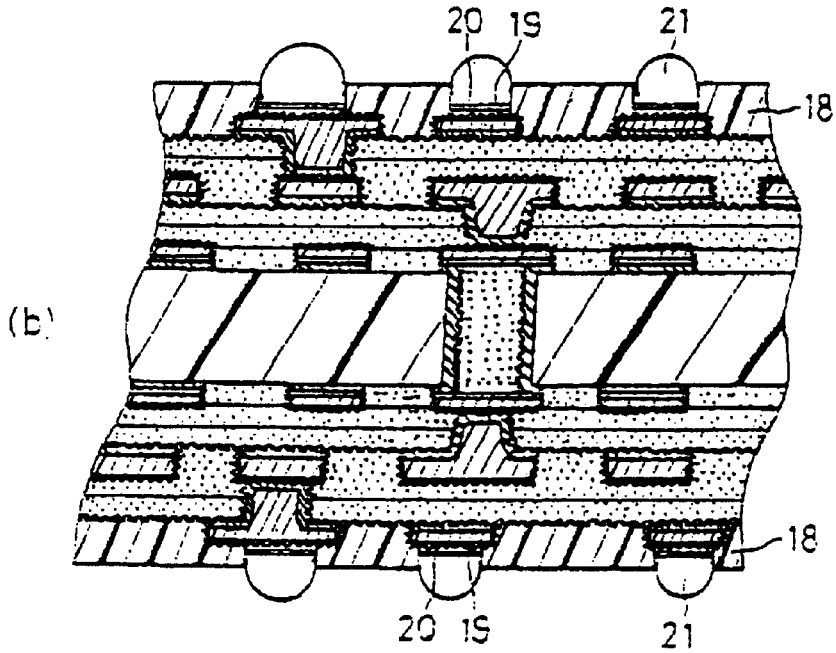

(21) Further, each one layer of an upper interlaminar insulating resin layer 12 and a conductor circuit 9 (inclusive of viahole 17) was laminated by repeating the steps (12) to (20) to obtain a multilayer circuit substrate (see FIG. 8(a)). In this step, a roughened layer 11 composed of copper-nickel-phosphorus was formed on the surface of the conductor circuit, but a tin substitution plated layer was not formed on the surface of the roughened layer 11.

(22) On the other hand, a solder resist composition was prepared by mixing 46.67 parts by weight of a photosensitized oligomer (molecular weight: 4,000) obtained by acrylating 50% of epoxy groups of a cresol novolac type epoxy resin (manufactured by Nippon Kayaku Co., Ltd.) as a 60% by weight solution in DMDG, 14.121 parts by weight of a bisphenol A type epoxy resin (manufactured by Yuka Shell Co., Ltd., trade name: Epikote 1001) as a 80% by weight solution in methyl ethyl ketone, 1.6 parts by weight of an imidazole curing agent (manufactured by Shikoku Kasei Co., Ltd., 2E4MZ-CN), 1.5 parts by weight of a polyvalent acrylic monomer (manufactured by Nippon Kayaku Co., Ltd., R604) as a photosensitive monomer, 3.0 parts by weight of a polyvalent acrylic monomer (manufactured by Kyoeisha Chemical Co., Ltd., DPE6A), and 0.36 part by weight of a leveling agent (manufactured by Kyoeisha Chemical Co., Ltd., Polyflow No. 75) composed of an acrylic ester polymer, adding 2.0 parts by weight of benzophenone (manufactured by Kanto Kagaku Co., Ltd.) as a photoinitiator and 0.2 part by weight of EAB (manufactured by Hodogaya Kagaku Co., Ltd.) as a photosensitizer, and 1.0 part by weight of DMDG (diethylene glycol dimethyl ether) to the mixture and adjusting a viscosity to 1.4±0.3 Pa·s at 25° C.

The viscosity was measured by B-type viscometer (manufactured by Tokyo Keiki Co., Ltd., model: DVL-B) using a rotor No. 4 at 60 rpm and a rotor No. 3 at 6 rpm.

(23) The above solder resist composition was applied to both surfaces of the multilayer wiring substrate obtained in the step (21) at a thickness of 20 μm. Then it was dried at 70° C. for 20 minutes and at 70° C. for 30 minutes and thereafter a soda-lime glass substrate of 5 mm in thickness depicted with circle patterns (mask patterns) for solder resist openings through chromium layer was closely placed on the solder resist layer so as to face the chromium layer side thereto, exposed to an ultraviolet ray irradiation at 1,000 mJ/cm$^2$ and developed with DMTG. Further, it was heated at 80° C. for 1 hour, at 100° C. for 1 hour, at 120° C. for 1 hour and at 150° C. for 3 hours to form a pattern of solder resist layer 18 (thickness: 20 μm) having an opening (opening size: 200 μm) in the solder pad.

(24) The substrate provided with the solder resist layer 18 was immersed for 20 minutes in an electroless nickel plating solution of pH of 5 containing 30 g/l of nickel chloride, 10 g/l of sodium hypophosphite and 10 g/l of sodium citrate to form a nickel plated layer 19 having a thickness of 5 μm in the opening. The substrate was then immersed in an electroless gold plating solution containing 2 g/l of potassium gold cyanide, 75 g/l of ammonium chloride, 50 g/l of sodium citrate and 10 g/l of sodium hypophosphite at 93° C. for 23 seconds to form a gold plated layer 20 of 0.03 μm in thickness on the nickel plated layer 19.

(25) A solder paste was printed on the opening of the solder resist layer and reflowed at 200° C. to form a solder bump (solder body), thereby a multilayer printed wiring board having solder bumps was obtained (see FIG. 8(b)).

Incidentally, tin-silver, tin-indium, tin-zinc, tin-bismuth or other solders can be employed as the solder.

Comparative Example 4

A multilayer printed wiring board was produced in a similar manner to Example 1, except that the following composition was used as the resin composition for filling through-hole.

To be more specific, a resin composition for filling through-hole was prepared by kneading through three rolls 3.5 parts by weight of a cresol novolac type epoxy resin (manufactured by Yuka Shell Co., Ltd., Epikote 152), 14.1 parts by weight of a bisphenol F type epoxy resin (manufactured by Yuka Shell Co., Ltd., Epitoke 807), 1.2 parts by weight of an imidazole curing agent (manufactured by Shikoku Kasei co., Ltd., 2E4MZ-CN) and 100 parts by weight of copper powder having an average particle size of 15 μm, and adjusting a viscosity to the range from 200 to 300 Pa·s at 22±1° C.

Example 6

The procedure of Example 1 was repeated to give a multilayer printed wiring board, except that the following resin composition was employed as the resin composition for filling through-hole.

To be more specific, a resin composition for filling through-hole was prepared by mixing 17.6 parts by weight of a bisphenol F type epoxy resin (manufactured by Yuka Shell Co., Ltd., Epikote 807), 1.0 part by weight of ultrafine silica particles (Aerosil R202) having an average particle size of 14 nm, 1.2 parts by weight of an imidazole curing agent (Shikoku Kasei Co., Ltd., 2E4MZ-CN) and 100 parts by weight of copper powder having an average particle size of 15 μm.

Example 7

A multilayer printed wiring board was prepared in the same manner as in Example 1, except that the following resin composition was used as the resin composition for filling through-hole.

That is, a resin composition for filling through-hole was prepared by kneading, through three rolls, 3.5 parts by weight of a cresol novolac type epoxy resin (manufactured by Yuka Shell Co., Ltd., Epikote 152), 1.0 part by weight of ultrafine silica particles (Aerosil R202) having an average particle size of 14 nm, 14.1 parts by weight of a bisphenol F type epoxy resin (manufactured by Yuka Shell Co., Ltd., Epitoke 807), 1.2 parts by weight of an imidazole curing agent (manufactured by Shikoku Kasei Co., Ltd., 2E4MZ-CN) and 100 parts by weight of silica particles having an average particle size of 10 μm, and adjusting a viscosity to the range from 200 to 300 Pa·s at 22±1° C.

Example 8

A multilayer printed wiring board was produced in a similar manner to Example 1, except that the following resin composition for filling through-hole was used and that after polishing the surface of the filler, the epoxy resin exposed from the surface was removed by chromic acid.

To be more specific, a resin composition for filling through-hole was prepared by kneading through three rolls 3.5 parts by weight of a cresol novolac type epoxy resin (manufactured by Yuka Shell Co., Ltd., Epitoke 152), 14.1 parts by weight of a bisphenol F type epoxy resin (manufactured by Yuka Shell Co., Ltd., Epitoke 807), 1.0 part by weight of ultrafine silica particles (Aerosil R202) having an average particle size of 14 nm, 1.2 parts by weight of an imidazole curing agent (manufactured by Shikoku Kasei Co., Ltd., 2E4MZ-CN) and 100 parts by weight of epoxy resin particles (manufactured by Sanyo Kasei Co., Ltd., Polymerpole) having an average particle size of 1 μm, and adjusting the viscosity of the mixture to the range from 200 to 300 Pa·s at 22±1° C.

Comparative Example 5

The procedure of Example 1 was repeated to give a multilayer printed wiring board, except that the following resin composition was employed as the resin composition for filling through-hole.

That is, a resin composition for filling through-hole containing 3.5 parts by weight of a cresol novolac type epoxy resin (manufactured by Yuka Shell Co., Ltd., Epikote 152), 14.1 parts by weight of a bisphenol F type epoxy resin (manufactured by Yuka Shell Co., Ltd., Epitoke 807), 1.2 parts by weight of an imidazole curing agent (manufactured by Shikoku Kasei Co., Ltd., 2E4MZ-CN) and 1.0 part by weight of a colloidal silica (Aerosil R202) having an average particle size of 14 nm was prepared.

Whether a break between a through-hole and a viahole caused by peeling or the like was formed or not was confirmed by conducting PCT (Pressure Cooker Test) in conditions of relative humidity of 100%, temperature of 121° C. and pressure of 2 atm for 200 hours with respect to the multilayer printed wiring boards of the examples and comparative examples. After the completion of PCT, the wiring boards were subjected to a heating test at 128° C. for 48 hours.

Results

No peeling of the conductor layer covering the filler, and no break caused by the peeling were observed in the wiring boards according to Examples 5 to 8, whereas the peeling, break and/or contact failure were observed in the wiring boards according to Comparative Examples 4 and 5.

To be more specific, in the wiring board according to Comparative Example 4 where ultrafine silica particles were not used, the copper powder precipitated so as to cause the filler to peel from the conductor layer covering the filler, and thereby to invite a break between the through-hole and via-hole.

In addition, a part of the bisphenol F type epoxy resin flowed out of the through-hole due to viscosity fall in curing, and an indentation was formed on the surface of the filler. When a conductor layer covering the filler was formed above the indentation, a crevice was formed in the center of the conductor layer. Thus, even when a resin was applied and polished to smooth the surface of the substrate, the resin remained in the central crevice, and a connection to the via-hole could not be established.

In the wiring board according to Comparative Example 5, the cured filler and the conductor layer covering the filler were never adhered to each other so as to cause peeling and hence a break between the through-hole and the conductor layer. No peeling was observed in the wiring boards according to Examples 5 and 6, whereas a peeling was observed in the wiring boards according to Examples 7 and 8. It is estimated that peeling does not occur in the wiring boards of Examples 5 and 6because the copper powder was completely integrated with the conductor layer.

Industrial Applicability

As described above, the printed wiring board according to the present invention is useful for a multilayer wiring board which is used as a packaging substrate for packing IC chips, in particular for a multilayer printed wiring board obtained by a semi-additive process for a full-additive process. In addition, the resin composition according to the present invention is applicable as through-holes, as well as an interlaminar insulating resin layer of a printed wiring board.

What is claimed is:

1. A multilayer printed wiring board comprising:

a substrate [provided with] *having* at least one through-hole *structure*, [the substrate having] *the at least one*

*through-hole structure comprising a plated film and being filled with a filler;* at least one interlaminar resin insulating layer formed [thereon] *on the substrate;* and at least one conductor circuit formed on the at least one interlaminar resin insulating layer[, the at least one through-hole being filled with filler], wherein [an internal] *a* surface *of the plated film* of the at least one through-hole *structure* is roughened, and the filler comprises metal particles and one of thermosetting and thermoplastic [resin] *resins*.

2. The multilayer printed wiring board according to claim 1, wherein the substrate is a multilayer core substrate formed by laminating at least one conductor layer and at least one prepreg in alternating order.

3. The multilayer printed wiring board according to claim 1, wherein at least one through-hole *structure* formed [on] *in* the substrate has a pitch interval of equal to or less than 700 μm.

4. The multilayer printed wiring board according to claim 1, [comprising build-up wiring layers including at least one via-hole provided in the at least one interlaminar resin insulating layer] wherein *the at least one interlaminar resin insulating layer comprises a plurality of interlaminar resin insulating layers, the plurality of interlaminar resin insulating layers and at least one via-hole provided in the interlaminar resin insulating layers to form build-up wiring layers, and* the build-up wiring layers are formed on both surfaces of the substrate[,] and have the same number of layers [with each other] *on both surfaces of the substrate*.

5. The multilayer printed wiring board comprising*:* a substrate [provided with] *having* at least one through-hole *structure*, [the substrate having] *the at least one through-hole structure being filled with a filler;* at least one interlaminar resin insulating layer formed [thereon] *on the substrate;* and at least one conductor circuit formed on the at least one interlaminar resin insulating layer[, the at least one through-hole being filled with filler], wherein an internal surface of the at least one through-hole *structure* is roughened, and the filler comprises *a* particulate substance *including metal particles* having a particle size of from 0.1 to 30 μm, *a* resin, and *an* ultrafine inorganic powder having a particle size from [1 to 1000] *2 to 100* nm.

6. The multilayer printed wiring board according to claim 5, wherein the filler is a nonconducting composition [containing metal particles].

7. The multilayer printed wiring board according to claim 5, wherein the particulate substance *further* comprises at least one of [metal particles,] inorganic particles and resin particles.

8. The multilayer printed wiring board according to claim 5, wherein the resin comprises at least one of bisphenol epoxy resin and novolac epoxy resin.

9. The multilayer printed wiring board according to claim 5, wherein the substrate is a multilayer core substrate formed by laminating at least one conductor layer and at least one prepeg in alternating order.

10. The multilayer printed wiring board according to claim 5, wherein the at least one through-hole *structure* formed [on] *in* the substrate has a pitch interval of equal to or less than 700 μm.

11. The multilayer printed wiring board according to claim 5, [comprising build-up wiring layers including at least one via-hole provided in the at least one interlaminar resin insulating layer] wherein *the at least one interlaminar resin insulating layer comprises a plurality of interlaminar resin insulating layers, the plurality of interlaminar resin insulating layers and at least one via-hole provided in the interlaminar resin insulating layers to form build-up wiring layers, and* the build-up wiring layers are formed on both surfaces of the substrate[,] and have the same number of layers [with each other] *on both surfaces of the substrate*.

12. A multilayer printed wiring board comprising*:* a substrate [provided with] *having* at least one through-hole *structure*, [the substrate having] *the at least one through-hole structure comprising a plated film and being filled with a filler;* at least one interlaminar resin insulating layer formed [thereon] *on the substrate;* and at least one conductor circuit formed on the at least one interlaminar resin insulating layer[, the at least one through-hole being filled with filler], wherein [an internal] *a* surface *of the plated film* of the at least one through-hole *structure* is roughened, [and] the filler comprises metal particles and one of thermosetting and thermoplastic [resin] *resins*, and an exposed portion of the filler in the at least one through-hole is covered with a [portion of the at least one conductor circuit] *through-hole-covering conductor layer*.

13. The multilayer printed wiring board according to claim 12, wherein [a roughened layer is formed on] a surface of the [at least one conductor circuit] *through-hole-covering conductor layer* covering at least the one through-hole *structure is roughened*.

14. The multilayer printed wiring board according to claim 12, wherein the substrate is a multilayer core substrate formed by laminating at least one conductor layer and at least one prepreg in alternating order.

15. The multilayer printed wiring board according to claim 12, wherein the at least one through-hole *structure* formed [on] *in* the substrate has a pitch interval of equal to or less than 700 μm.

16. The multilayer printed wiring board according to claim 12, [comprising build-up wiring layers including the at least one via-hole provided in the at least one interlaminar resin insulating layer] wherein *the at least one interlaminar resin insulating layer comprises a plurality of interlaminar resin insulating layers, the plurality of interlaminar resin insulating layers and at least one via-hole provided in the interlaminar resin insulating layers to form build-up wiring layers, and* the build-up wiring layers are formed on both surfaces of the substrate[,] and have the same number of layers [with each other] *on both surfaces of the substrate*.

17. The multilayer printed wiring board comprising*:* a substrate [provided with] *having* at least one through-hole *structure*, [the substrate having] *the at least one through-hole structure being filled with a filler;* at least one interlaminar resin insulating layer formed [thereon] *on the substrate;* and at least one conductor circuit formed on the at least one interlaminar resin insulating layer[, the at least one through-hole being filled with filler], wherein an internal surface of the at least one through-hole *structure* is roughened, [and] the filler comprises *a* particulate substance having a particle size of from 0.1 to 30 μm, *a* resin, and *an* ultrafine inorganic powder having a particle size from [1 to 1000] *2 to 100* nm, and an exposed portion of the filler in the at least one through-hole *structure* is covered with a [portion of the at least one conductor circuit] *through-hole-covering conductor layer*.

18. The multilayer printed wiring board according to claim 17, wherein the filler is a nonconducting composition containing metal particles.

19. The multilayer printed wiring board according to claim 17, wherein the particulate substance comprises at least one of metal particles, inorganic particles and resin particles.

20. The multilayer printed wiring board according to claim 17, wherein the resin comprises at least one of bisphenol epoxy resin and novolac epoxy resin.

21. The multilayer printed wiring board according to claim 17, wherein [a roughened layer is formed on] a surface of the [at least one conductor circuit] *through-hole-covering conductor layer* covering the at least one through-hole *structure is roughened*.

22. The multilayer printed wiring board according to claim 17, wherein the substrate is a multilayer core substrate formed by laminating at least one conductor layer and at least one prepreg in alternating order.

23. The multilayer printed wiring board according to claim 17, wherein at least one through-hole *structure* formed [on] *in* the substrate has a pitch interval equal to or less than 700 μm.

24. The multilayer printed wiring board according to claim 17, [comprising build-up wiring layers including the at least one via-hole provided in the at least one interlaminar resin insulating layer] wherein *the at least one interlaminar resin insulating layer comprises a plurality of interlaminar resin insulating layers, the plurality of interlaminar resin insulating layers and at least one via-hole provided in the interlaminar resin insulating layers to form build-up wiring layers, and* the build-up wiring layers are formed on both surfaces of the substrate[,] and have the same number of layers [with each other] *on both surfaces of the substrate*.

25. A multilayer printed wiring board comprising*:* a substrate [provided with] *having* at least one through-hole *structure*, [the substrate having] *the at least one through-hole structure comprising a plated film and being filled with a filler;* at least one interlaminar resin insulating layer formed [thereon] *on the substrate;* and at least one conductor circuit formed on the at least one interlaminar resin insulating layer[, the at least one through-hole being filled with filler], wherein [an internal] *a* surface of *the plated film of* the at least one through-hole *structure* is roughened, [and] the filler comprises metal particles and one of thermosetting and thermoplastic [resin] *resins*, [and] an exposed surface of the filler in the at least one through-hole *structure* is covered with a [portion of the at least one conductor circuit] *through-hole-covering conductor layer*, and at least one viahole is formed in the at least one interlaminar resin insulating layer [just] *directly* above the [at least one conductor circuit and is connected to the at least one conductor circuit] *through-hole-covering conductor layer*.

26. The multilayer printed wiring board according to claim 25, wherein a [roughened layer is formed on] surface of the through-hole-covering conductor layer *is roughened*.

27. The multilayer printed wiring board according to claim 25, wherein the substrate is a multilayer core substrate formed by laminating at least one conductor layer and at least one prepreg is alternating order.

28. The multilayer printed wiring board according to claim 25, wherein the at least one through-hole *structure* formed [on] *in* the substrate has a pitch interval of equal to or less than 700 μm.

29. The multilayer printed wiring board according to claim 25, [comprising build-up wiring layers including the at least one via-hole provided in the at least one interlaminar resin insulating layer] wherein *the at least one interlaminar resin insulating layer comprises a plurality of interlaminar resin insulating layers, the plurality of interlaminar resin insulating layers and at least one via-hole provided in the interlaminar resin insulating layers to form build-up wiring layers, and* the build-up wiring layers are formed on both surfaces of the substrate[,] and have the same number of layers [with each other] *on both surfaces of the substrate*.

30. A multilayer printed wiring board comprising*:* a substrate [provided with] *having* at least one through-hole *structure*, [the substrate having] *the at least one through-hole structure being filled with a filler;* at least one interlaminar resin insulating layer formed [thereon] *on the substrate;* and at least one conductor circuit formed on the at least one interlaminar resin insulating layer[, the at least one through-hole being filled with filler], wherein an internal surface of the at least one through-hole *structure* is roughened, and the filler comprises *a* particulate substance having a particle size of from 0.1 to 30 μm, *a* resin, and *an* ultrafine inorganic powder having a particle size from [1 to 1000] *2 to 100* nm, and an exposed surface of the filler in the at least one through-hole *structure* is covered with a [portion of the at least one conductor circuit] *through-hole-covering conductor layer*, and at least one viahole is formed in the at least one interlaminar resin insulating layer [just] *directly* above the [at least one conductor circuit and is connected to the at least one conductor circuit] *through-hole-covering conductor layer*.

31. The multilayer printed wiring board according to claim 30, wherein the filler is a nonconducting composition containing metal particles.

32. The multilayer printed wiring board according to claim 30, wherein the particulate substance comprises at least one of metal particles, inorganic particles and resin particles.

33. The multilayer printed wiring board according to claim 30, wherein the resin comprises at least one of bisphenol epoxy resin and novolac epoxy resin.

34. The multilayer printed wiring board according to claim 30, wherein [a roughened layer is formed on] a surface of the [at least one conductor circuit covering the at least one through-hole] *through-hole-covering conductor layer is roughened*.

35. The multilayer printed wiring board according to claim 30, wherein the substrate is a multilayer core substrate formed by laminating at least one conductor layer and at least one prepreg in alternating order.

36. The multilayer printed wiring board according to claim 30, wherein the least one through-hole *structure* formed [on] *in* the substrate has a pitch interval of equal to or less than 700 μm.

37. The multilayer printed wiring board according to claim 30, [comprising build-up wiring layers including the at least one via-hole provided in the at least one interlaminar resin insulating layer] wherein *the at least one interlaminar resin insulating layer comprises a plurality of interlaminar resin insulating layers, the plurality of interlaminar resin insulating layers and at least one via-hole provided in the interlaminar resin insulating layers to form build-up wiring layers, and* the build-up wiring layers are formed on both surfaces of the substrate[,] and have the same number of layers [with each other] *on both surfaces of the substrate*.

38. A resin composition for filling through-hole of a printed wiring board comprising:

*a* particulate substance comprising metal [powder] *particles* having an average particle size ranging from 0.1 to 30 μm and being present in an amount ranging from 30 to 90% by weight of the total solids content of the resin composition[,]*;*

*a* resin and

*an* ultrafine inorganic powder having an average particle size ranging from [1 to 1,000] *2 to 100* nm.

39. The resin composition according to claim 38, which is a nonconducting composition.

40. The resin [compositon] *composition* according to claim 38, wherein the particulate substance *further* comprises at least one member selected from [metal particulate,] *the group consisting of* inorganic particles [or]*and* resin particles.

41. The resin composition according to claim 38, wherein the resin comprises at least one of bisphenol epoxy resin and novolac epoxy resin.

42. The resin composition according to claim 41, wherein the bisphenol epoxy resin comprises at least one of bisphenol P epoxy resin and bisphenol A epoxy resin.

43. The resin composition according to claim 41, wherein the novolac epoxy resin comprises at least one of phenol novolac epoxy resin and cresol novolac epoxy resin.

44. The resin composition according to claim 41, wherein the composition ratio of the novolac epoxy resin to the bisphenol epoxy resin ranges from 1/1 to 1/100 by weight.

45. The resin composition according to claim 38, wherein the ultrafine inorganic powder is present in an amount ranging from 0.1 to 5% by weight of the total solids content of the resin composition and has an average particle size ranging from 2 to 200 nm.

46. The resin composition according to claim 38, wherein the ultrafine inorganic powder [is] *comprises at least one material* selected from *the group consisting of* silica, alumina, silicon carbide [or] *and* mullite.

47. The resin composition according to claim 46, wherein the ultrafine inorganic powder is silica.

48. A process of producing a multilayer printed wiring board comprising:

*forming a hole in a substrate;*

[forming at least one conductor layer on both surfaces of a substrate by electroless plating,]

forming [at least one] *a* through-hole [on] *structure in* the substrate[,] *by plating a layer on a surface of the hole;*

[forming a roughened layer on an internal] *roughening a* surface *of the plated layer* of the [at least one] through-hole *structure;*[,]

filling the [at least one] through-hole *structure including the plated layer* having [the] *a* roughened [layer on its internal] surface with *a* filler comprising metal particles and one of thermosetting and thermoplastic [resin, and drying and curing the filler,] *resins;*

*forming a first conductor layer having a first conductor circuit on the substrate;* forming [at least one] *a first* interlaminar resin insulating layer[, and] *on the first conductor circuit and the substrate;*

*forming an opening for a via hole in the interlaminar resin insulating layer; and* forming [at least one] *a second conductor layer having a second* conductor circuit [by electroless plating] *on the first interlaminar resin insulating layer and the via hole in the opening,*

*wherein the via hole is formed to connect the first conductor circuit and the second conductor circuit.*

49. The process according to claim 48, wherein the [internal] surface of the [at least one] *plated layer of the* through-hole *structure* is roughened by a treatment selected from *the group consisting of* an oxidation-reduction treatment, a treatment with an aqueous mixed solution of an organic acid and a copper (II) complex, [or] *and* a plating treatment with a needle ternary alloy of copper-nickel-phosphorous.

[50. The process according to claim 48, wherein forming the least one conductor layer comprises electroplating after electroless plating.]

51. The process according to claim 48, wherein forming the [at least one conductor circuit] *first conductor circuit and the second conductor circuit* comprises electroplating after electroless plating.

52. A process of producing a multilayer printed wiring board, comprising:

*forming a hole in a substrate;*

[forming at least one conductor layer on both surfaces of a substrate by electroless plating,]

forming [at least one] *a* through-hole [through] *structure in* the substrate[,] *by plating a layer on a surface of the hole;*

[forming a roughened layer on an internal] *roughening a* surface *of the plated layer* of the [at least one] through-hole[,] *structure;* filling the [at least one] through-hole *structure including the plated layer* having [the] *a* roughened [layer on its internal] surface with *a* filler comprising *a* particulate substance *including metal particles* having a particle size of from 0.1 to 30 μm, *a* resin, and *an* ultrafine inorganic powder having a particle size from [1 to 1000] *2 to 100* nm[, and drying and curing the filler,]*;*

*forming a first conductor layer having a first conductor circuit on the substrate;* forming [at least one] *a first* interlaminar resin insulating layer[, and] *on the first conductor circuit and the substrate;*

*forming an opening for a via hole in the first interlaminar resin insulating layer; and* forming [at least one] *a second conductor layer having a second* conductor circuit [by electroless plating] *on the first interlaminar resin insulating layer and the via hole in the opening,*

*wherein the via hole is formed to connect the first conductor circuit and the second conductor circuit.*

53. The process according to claim 52, wherein the filler is a nonconducting composition [containing metal particles].

54. The process according to claim 52, wherein the particulate substance *further* comprises at least one of [metal particles,] inorganic particles and resin particles.

55. The process according to claim 52, wherein the resin comprises at least one of bisphenol epoxy resin and novolac epoxy resin.

56. The process according to claim 52, wherein forming the [at least one] *first conductor layer and the second* conductor layer comprises electroplating after electroless plating.

57. The process according to claim 52, wherein forming the [at least one] *first conductor circuit and the second* conductor circuit comprises electroplating after electroless plating.

[58. A process of producing a multilayer printed wiring board comprising:

forming at least one conductor layer on both surfaces of a substrate by electroless plating, forming at least one through-hole on the substrate, forming a roughened layer on an internal surface of the at least one through-hole, filling the at least one through-hole having the roughened layer on its internal surface with filler comprising metal particles and one of thermosetting and thermoplastic resin, and drying and curing the filler, forming a portion of the at least one conductor layer on the at least one through-hole by subjecting a portion of the filler on the at least one through-hole to electroless plating, forming at least one interlaminar resin insulating layer, and forming at least one conductor circuit by electroless plating.]

[59. The process according to claim 58, wherein the internal surface of the at least one through-hole is roughened by any process selected from an oxidation-reduction treatment, a treatment with an aqueous mixed solution of an organic acid and a copper (II) complex, or a plating treatment with a needle ternary alloy of copper-nickel-phosphorus.]

[60. The process according to claim 58, wherein the forming the portion of the at least one conductor layer on the at least one through-hole comprises smoothing a surface of the substrate, applying catalyst nuclei to the smoothed surface of the substrate, subjecting the substrate to electroless plating to form a plating layer, forming an etching resist just above the at least one through-hole and on a portion of the at least one through-hole and the plating layer which is to become a part of the at least one conductor circuit, removing the plating layer in a portion of the substrate where the etching resist is not formed, and removing the etching resist.]

[61. The process according to claim 60, comprising subjecting the substrate to electroplating after electroless plating.]

[62. The process according to claim 60, wherein the forming the portion of the at least one conductor layer on the at least one through-hole comprises smoothing a surface of the substrate, forming a plating resist on a part of the smoothed surface of the substrate, subjecting a portion of the smoothed surface of the substrate where the resist is not formed to electroplating to form the at least one conductor layer and the at least one conductor circuit, and removing the plating resist with the at least one conductor layer located beneath the plating resist by etching.]

[63. The process according to claim 60, wherein the forming the portion of the at least one conductor layer on the at least one through-hole comprises roughening a surface of the portion of the at least one conductor layer by a treatment selected from oxidation-reduction treatment, treatment with an aqueous mixed solution of an organic acid and a copper (II) complex, or plating treatment with needle ternary alloy of copper-nickel-phosphorus.]

[64. The process according to claim 60, wherein forming the at least one conductor layer comprises electroplating after electroless plating.]

[65. The process according to claim 60, wherein forming the portion of the at least one conductor layer on the at least one through-hole comprises electroplating after electroless plating.]

[66. A process of producing a multilayer printed wiring board comprising:

forming at least one conductor layer on both surfaces of a substrate by electroless plating, forming at least one through-hole on the substrate, forming a roughened layer on an internal surface of the at least one through-hole, filling the at least one through-hole having the roughened layer on its internal surface with filler comprising particulate substance having a particle size of from 0.1 to 30 μm, resin, and ultrafine inorganic powder having a particle size from 1 to 1000 nm, and drying and curing the filler, forming a portion of the at least one conductor layer on the at least one through-hole by subjecting a portion of the filler on the at least one through-hole to electroless plating, forming at least one interlaminar resin insulating layer, and forming at least one conductor circuit by electroless plating.]

67. The process according to claim [66] *52*, wherein the filler is a nonconducting composition having a specific resistance of equal to or more than $1\times10^6$ [$\Omega\cdot cm^2$ and containing metal particles] $\Omega\cdot cm$.

68. The process according to claim 67, wherein the particulate substance *further* comprises at least one of [metal particles,] inorganic particles and resin particles.

[69. The process according to claim 67, wherein the resin comprises at least one of bisphenol epoxy resin and novolac epoxy resin.]

[70. The process according to claim 66, wherein forming the at least one conductor layer comprises electroplating after electroless plating.]

71. The process according to claim [66] *52*, [wherein forming the portion of the at least one conductor layer on the at least one through-hole comprises] *wherein the forming of the first conductor layer includes subjecting a portion of the filler in the through-hole to electroless plating and* electroplating [after electroless plating] *to cover the through-hole*.

72. A process of producing a multilayer printed wiring board comprising:

*forming a hole in a substrate;*

[forming at least one conductor layer on both surfaces of a substrate by electroless plating,]

forming [at least one] *a* through-hole [on] *structure in* the substrate[.] *by plating a layer on a surface of the hole*;

[forming a roughened layer on an internal] *roughening a* surface of *the plated layer of* the [at least one] through-hole[.] *structure;* filling the [at least one] through-hole *structure including the plated layer* having [the] *a* roughened [layer on its internal] surface with *a* filler comprising metal particles and one of [the] thermosetting and thermoplastic [resin, and drying and curing the filler,] *resins;* forming a [portion of the at least one] *first* conductor layer *having a through-hole-covering conductor layer* on the [at least one] through-hole [by subjecting a portion of the filler on the at least one through-hole to electroless plating,] *structure;* forming [at least one] *a first* interlaminar resin insulating layer[.] *on the first conductor layer; and* forming at least one viahole *in the first interlaminar resin insulating layer* and [at least one] *a second* conductor circuit [in] *on* the [at least one] *first* interlaminar resin insulating layer [located just above the at least one through-hole, and],

*wherein the at least one viahole is formed at a position directly above the through-hole structure and provided to connect the through-hole-covering conductor layer with the second conductor circuit*

[connecting the at least one viahole to the at least one conductor circuit in the at least one interlaminar resin insulating layer located just above the at least one through-hole].

73. The process according to claim 72, wherein the [internal] surface of the [at least one] *plated layer of the* through-hole *structure* is roughened by a treatment selected from *the group consisting of* oxidation-reduction treatment, treatment with an aqueous mixed solution of an organic acid and a copper (II) complex, [or] *and* plating treatment with needle ternary alloy of copper-nickel-phosphorus.

74. The process according to claim 72, wherein the forming the [portion of the at least one conductor layer] *through-hole-covering conductor layer* on the [at least one] through-hole *structure* comprises smoothing a surface of the substrate, applying catalyst nuclei to the smoothed surface of the substrate, subjecting the substrate to electroless plating to form a plating layer, *subjecting the substrate to electroplating,* forming an etching resist [just] *directly* above the [at least one] through-hole *structure* and on a portion of the [at least one] through-hole [and the plating layer which is to become a part of the at least one conductor circuit] *structure*, removing the plating layer in a portion of the substrate where the etching resist is not formed, and removing the etching resist.

75. The process according to claim 72, wherein the forming the [portion of the at least one conductor layer] *through-hole-covering conductor layer* on the [at least one] through-hole *structure* comprises smoothing a surface of the substrate, *subjecting the substrate to electroless plating to form a plating layer,* forming a plating resist on [a part of the smoothed surface of the substrate] *the plating layer*, subjecting [a portion of the smoothed surface of] the substrate to [where the resist is not formed to electroplating to form the at least one conductor layer and the at least one conductor circuit] *electroplating*, [and] removing the plating resist [with], *and etching* the [at least one conductor layer] *plating layer* located beneath the plating resist [by etching] *to form the through-hole-covering conductor layer*.

76. The process according to claim 72, wherein the forming the [portion of the at least one conductor layer] *through-hole-covering conductor layer* on the [at least one] through-hole *structure* comprises roughening a surface of the portion of the [at least one conductor layer] *through-hole-covering conductor layer* by a treatment selected from *the group consisting of* oxidation-reduction treatment, treatment with an aqueous mixed solution of an organic acid and a copper (II) complex, [or] *and* plating treatment with needle ternary alloy of copper-nickel-phosphorus.

[77. The process according to claim 72, wherein the at least one viahole is formed just above the at least one through-hole through the interposition of the at least one interlaminar resin insulating layer by roughening the at least one interlaminar resin insulating layer provided with an opening for the at least one viahole, applying catalyst nuclei directly to the roughened interlaminar resin insulating layer, subjecting the roughened interlaminar resin insulating layer to electroless plating, and etching the plated layer so as to leave the at least one viahole and the at least one conductor circuit portion.]

[78. The process according to claim 72, wherein the at least one viahole is formed just above the at least one through-hole through the interposition of the at least one interlaminar resin insulating layer by applying catalyst nuclei directly to the interlaminar resin insulating layer without roughening, subjecting the interlaminar resin insulating layer to electroless plating, and etching the plated layer so as to leave at least one viahole and the at least one conductor circuit portion.]

79. The process according to claim 72, wherein forming [at least one] *the first* conductor layer on both surfaces of [a] *the* substrate comprises electroplating after electroless plating.

80. The process according to claim 72, wherein forming [a portion of the at least one conductor layer] *through-hole-covering conductor layer* on the [at least one] through-hole *structure* comprises electroplating after electroless plating.

81. A process of producing a multilayer printed wiring board comprising:

*forming a hole in a substrate;*

[forming at least one conductor layer on both surfaces of a substrate by electroless plating,]

forming [at least one] *a* through-hole [on] *structure in* the substrate[,] *by plating a layer on a surface of the hole;*

[forming a roughened layer on an internal] *roughening a* surface of *a plated layer of* the [at least one] through-hole *structure*, filling the [at least one] through-hole *structure including the plated layer* having [the] *a* roughened [layer on its internal] surface with *a* filler comprising *a* particulate substance having a particle size of from 0.1 to 30 μm, *a* resin, and *an* ultrafine inorganic powder having a particle size from [1 to 1000] *2 to 100* nm[, and drying and curing the filler,]*;* forming a [portion of the at least one] *first* conductor layer *having a through-hole-covering conductor layer* on the [at least one] through-hole [by subjecting a portion of the filler on the at least one through-hole to electroless plating,] *structure;* forming [at least one] *a first* interlaminar resin insulating layer[,]*; and* forming at least one viahole *in the first interlaminar resin insulating layer* and [at least one] *a second* conductor circuit [in] *on* the [at least one] *first* interlaminar resin insulating layer [located just above the at least one through-hole, and],

*wherein the viahole is formed at a position directly above the through-hole structure and provided to connect the through-hole-covering conductor layer with the second conductor circuit*

[connecting the at least one viahole to the at least one conductor circuit located just above the at least one through-hole].

82. The process according to claim 81, wherein the filler is a nonconducting composition and [further] *the particulate substance* comprises metal particles.

83. The process according to claim [82] *81*, wherein the particulate substance comprises at least one of metal particles, inorganic particles and resin particles.

84. The process according to claim 82, wherein the resin comprises at least one of bisphenol epoxy resin and novolac epoxy resin.

85. The process according to claim 82, wherein forming the [at least one] *first* conductor layer comprises electroplating after electroless plating.

86. The process according to claim 82, wherein forming the [portion of the at least one] *first* conductor layer on the [at least one] through-hole *structure* comprises electroplating after electroless plating.

*87. A multilayer printed wiring board comprising:*

*a substrate having a through-hole structure comprising a plating layer and a filler provided in the through-hole structure, the plating layer having a roughened portion;*

*a first conductor layer having a first conductor circuit formed on the substrate and a through-hole-covering conductor layer covering the filler provided in the through-hole structure having the plating layer;*

*a first interlaminar resin insulating layer having a via hole and being formed on the substrate and the first conductor layer; and*

*a second conductor layer having a second conductor circuit formed on the first interlaminar resin insulating layer, the second conductor circuit being connected to the first conductor circuit by the via hole.*

*88. The multilayer printed wiring board according to claim 87, wherein said via hole is plated with a plated film or filled with a filler.*

*89. The multilayer printed wiring board according to claim 87, wherein a surface of said through-hole-covering conductor layer is roughened.*

*90. The multilayer printed wiring board according to claim 89, wherein a side face of said through-hole-covering conductor layer is roughened.*

*91. The multilayer printed wiring board according to claim 87, wherein the roughened portion of the plating layer forms a roughened internal surface, and the plating layer has a thickness of at least 0.1 μm and at most 10 μm.*

*92. The multilayer printed wiring board according to claim 87, wherein said substrate comprises a glass-epoxy substrate, a polymide substrate, a bismaleimide-triazine resin substrate, a fluororesin substrate, a copper-clad laminate resin substrate, a ceramic substrate, or a metal substrate.*

*93. The multilayer printed wiring board according to claim 1, wherein the filler is non-conductive.*

*94. The multilayer printed wiring board according to claim 12, wherein the filler is non-conductive.*

*95. The multilayer printed wiring board according to claim 25, wherein the filler is non-conductive.*

*96. The process according to claim 48, wherein the forming of the first conductor layer comprises forming a through-hole-covering conductor layer which covers the filler.*

*97. The process according to claim 96, wherein the via hole is formed on the through-hole-covering conductor layer and located directly over the filler.*

*98. The process according to claim 48, wherein the filler is a nonconductive composition.*

*99. The process according to claim 48, wherein the substrate comprises copper-clad laminate, and the filler protruded from the through-hole structure is removed by polishing.*

*100. The process according to claim 48, wherein the forming of the first conductor layer comprises forming a through-hole-covering conductor layer to cover the filler, and the forming of the through-hole-covering conductor layer comprises performing electroless plating and electroplating after the electroless plating.*

*101. The process according to claim 52, wherein the forming of the first conductor layer includes forming a through-hole-covering conductor layer which covers the filler.*

*102. The process according to claim 101, wherein the via hole is formed on the through-hole-covering conductor layer and located directly over the filler.*

*103. The process according to claim 52, wherein the substrate is copper-clad laminate and the filler protruded from the through-hole structure is removed by polishing.*

*104. The process according to claim 52, wherein the forming of the first conductor layer includes forming a through-hole-conductor layer which covers the filler, and the forming of the through-hole-conductor layer includes performing electroless plating and electroplating after the electroless plating.*

*105. The multilayer printed wiring board according to claim 87, wherein the via hole is formed on the through-hole-covering conductor layer.*

*106. The multilayer printed wiring board according to claim 87, wherein the via hole is formed on the through-hole-covering conductor layer, and the via hole is formed above the filler.*

*107. The multilayer printed wiring board according to claim 87, wherein the through-hole-covering conductor layer comprises an electroless plating film and an electroplating film on the electroless plating film.*

*108. The multilayer printed wiring board according to claim 87, wherein the filler comprises metal particles.*

*109. The multilayer printed wiring board according to claim 108, wherein the filler is non-conductive.*

*110. A process of producing a multilayer printed wiring board comprising:*

*forming a hole in a substrate;*

*forming a through-hole structure in the substrate by plating a layer on a surface of the hole;*

*roughening a portion of the plating layer of the through-hole structure;*

*filling a filler inside the through-hole structure;*

*forming a first conductor layer having a first conductor circuit on the substrate and a through-hole-covering conductor layer covering the filler;*

*forming a first interlaminar resin insulating layer on the first conductor layer and substrate;*

*forming an opening for a via hole in the interlaminar resin insulating layer; and*

*forming a second conductor layer having a second conductor circuit on the first interlaminar resin insulating layer and the via hole in the opening,*

*wherein the via hole is formed to connect the first conductor circuit and the second conductor circuit.*

*111. The process according to claim 110, wherein the via hole is formed on the through-hole-covering conductor layer at a position directly above the filler.*

*112. The process according to claim 110, wherein the filler comprises metal particles and one of thermosetting and thermoplastic resins.*

* * * * *

UNITED STATES PATENT AND TRADEMARK OFFICE

CERTIFICATE OF CORRECTION

PATENT NO. : RE 40,947 E
APPLICATION NO. : 10/829479
DATED : October 27, 2009
INVENTOR(S) : Motoo Asai et al.

It is certified that error appears in the above-identified patent and that said Letters Patent is hereby corrected as shown below:

In the Title page,
Item (22),
Please change the filing date of PCT application "Oct. 12, 1990" to --Oct. 12, 1998--.

Signed and Sealed this

Fifth Day of January, 2010

David J. Kappos

David J. Kappos
*Director of the United States Patent and Trademark Office*